(12) United States Patent
Shirata

(10) Patent No.: US 8,243,254 B2
(45) Date of Patent: Aug. 14, 2012

(54) EXPOSING METHOD, EXPOSURE APPARATUS, AND DEVICE FABRICATING METHOD

(75) Inventor: Yosuke Shirata, Saitama (JP)

(73) Assignee: Nikon Corporation, Tokyo (JP)

( * ) Notice: Subject to any disclaimer, the term of this patent is extended or adjusted under 35 U.S.C. 154(b) by 684 days.

(21) Appl. No.: 12/155,436

(22) Filed: Jun. 4, 2008

(65) Prior Publication Data

US 2008/0278695 A1    Nov. 13, 2008

Related U.S. Application Data

(63) Continuation of application No. PCT/JP2006/324369, filed on Dec. 6, 2006.

(30) Foreign Application Priority Data

Dec. 6, 2005   (JP) ................................. 2005-351657

(51) Int. Cl.
| | |
|---|---|
| G03B 27/32 | (2006.01) |
| G03B 27/42 | (2006.01) |
| G03B 27/52 | (2006.01) |
| G03B 27/58 | (2006.01) |

(52) U.S. Cl. ................. 355/30; 355/53; 355/72; 355/77
(58) Field of Classification Search .................... 355/30, 355/53, 72, 75, 77; 359/395
See application file for complete search history.

(56) References Cited

U.S. PATENT DOCUMENTS

| 4,465,368 A | 8/1984 | Matsuura et al. |
|---|---|---|
| 4,666,273 A | 5/1987 | Shimizu et al. |
| 5,493,403 A | 2/1996 | Nishi |
| 5,646,413 A | 7/1997 | Nishi |
| 5,738,165 A | 4/1998 | Imai |
| 6,208,407 B1 | 3/2001 | Loopstra |
| 6,228,544 B1 | 5/2001 | Ota |
| 6,235,438 B1 | 5/2001 | Suzuki et al. |
| 6,262,796 B1 | 7/2001 | Loopstra et al. |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,611,316 B2 | 8/2003 | Sewell |
| 6,721,034 B1 | 4/2004 | Horikawa |
| 6,721,039 B2 | 4/2004 | Ozawa |
| 6,778,257 B2 | 8/2004 | Bleeker et al. |
| 6,897,963 B1 | 5/2005 | Taniguchi et al. |

(Continued)

FOREIGN PATENT DOCUMENTS

EP   1 079 223 A1   2/2001

(Continued)

OTHER PUBLICATIONS

European Search Report issued in European Patent Application No. 06834124.7, dated Jul. 23, 2010.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus comprises: a first detection apparatus, which detects the temperature of a liquid after the liquid contacts a prescribed object; and a processing apparatus that detects the relationship between the temperature of the liquid and the temperature of the object based on the detection result of the first detection apparatus.

53 Claims, 9 Drawing Sheets

U.S. PATENT DOCUMENTS

| | | | |
|---|---|---|---|
| 6,952,253 B2 | 10/2005 | Lof et al. | |
| 7,075,111 B2 | 7/2006 | Oshima | |
| 7,312,848 B2 * | 12/2007 | Tanaka et al. | 355/53 |
| 7,483,117 B2 | 1/2009 | Hirukawa | |
| 7,505,111 B2 | 3/2009 | Hirukawa et al. | |
| 2002/0041377 A1 | 4/2002 | Hagiwara et al. | |
| 2002/0061469 A1 | 5/2002 | Tanaka | |
| 2005/0046813 A1 | 3/2005 | Streefkerk et al. | |
| 2005/0078286 A1 | 4/2005 | Dierichs et al. | |
| 2005/0140959 A1 | 6/2005 | Tsuji et al. | |
| 2005/0146694 A1 | 7/2005 | Tokita | |
| 2005/0146695 A1 | 7/2005 | Kawakami | |
| 2005/0206850 A1 | 9/2005 | Shimizu et al. | |
| 2005/0264780 A1 | 12/2005 | Graeupner | |
| 2005/0277068 A1 | 12/2005 | Endo et al. | |
| 2005/0280791 A1 | 12/2005 | Nagasaka et al. | |
| 2006/0007415 A1 | 1/2006 | Kosugi et al. | |
| 2006/0023188 A1 | 2/2006 | Hara | |
| 2006/0033892 A1 | 2/2006 | Cadee et al. | |
| 2006/0082744 A1 | 4/2006 | Hirukawa | |
| 2006/0087637 A1 | 4/2006 | Ottens et al. | |
| 2006/0231206 A1 | 10/2006 | Nagasaka et al. | |
| 2007/0070324 A1 | 3/2007 | Kuit et al. | |
| 2007/0146664 A1 * | 6/2007 | Zaal et al. | 355/53 |
| 2007/0153244 A1 | 7/2007 | Maria Zaal et al. | |
| 2008/0106707 A1 * | 5/2008 | Kobayashi et al. | 355/30 |
| 2009/0279059 A1 * | 11/2009 | Shirata et al. | 355/30 |

FOREIGN PATENT DOCUMENTS

| | | |
|---|---|---|
| EP | 1 420 298 A2 | 5/2004 |
| EP | 1 628 330 A1 | 2/2006 |
| EP | 1 713 115 A1 | 10/2006 |
| EP | 1 783 821 A1 | 5/2007 |
| JP | A-57-117238 | 7/1982 |
| JP | A-60-78454 | 5/1985 |
| JP | A-04-065603 | 3/1992 |
| JP | A-07-176468 | 7/1995 |
| JP | A-08-130179 | 5/1996 |
| JP | A-10-163099 | 6/1998 |
| JP | A-10-214783 | 8/1998 |
| JP | A-11-16816 | 1/1999 |
| JP | A-11-135400 | 5/1999 |
| JP | A-11-195602 | 7/1999 |
| JP | A-2000-164504 | 6/2000 |
| JP | A-2000-505958 | 10/2000 |
| JP | A-2001-267239 | 9/2001 |
| JP | A-2002-14005 | 1/2002 |
| JP | A-2002-198303 | 7/2002 |
| JP | A-2004-519850 | 7/2004 |
| JP | A-2004-289126 | 10/2004 |
| JP | A-2005-012201 | 1/2005 |
| JP | A-2005-123305 | 5/2005 |
| JP | A-2005-197447 | 7/2005 |
| JP | A-2005-252247 | 9/2005 |
| WO | WO 99/49504 | 9/1999 |
| WO | WO 99/60361 | 11/1999 |
| WO | WO 01/35168 A1 | 5/2001 |
| WO | WO 02/069049 A2 | 9/2002 |
| WO | WO 03/065428 A1 | 8/2003 |
| WO | WO 03/079418 A1 | 9/2003 |
| WO | WO 03/081648 A1 | 10/2003 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/090956 A1 | 10/2004 |
| WO | WO 2005/029559 A1 | 3/2005 |
| WO | WO 2005076324 A1 * | 8/2005 |
| WO | WO 2005/122218 A1 | 12/2005 |

OTHER PUBLICATIONS

International Search Report issued on PCT/JP2006/324369, dated Mar. 13, 2007 w/English translation.

Written Opinion issued on PCT/JP2006/324369, dated Mar. 13, 2007 w/English translation.

Office Action issued in EP Application No. 06834124.7 on May 3, 2011.

Feb. 21, 2012 Office Action issued in JP Application No. 2007-549154 (with English translation).

* cited by examiner

FIRST SUPPLY QUANTITY

SECOND SUPPLY QUANTITY

EXPOSING METHOD, EXPOSURE APPARATUS, AND DEVICE FABRICATING METHOD

CROSS-REFERENCE TO RELATED APPLICATION

This is a Continuation Application of International Application No. PCT/JP2006/324369, filed Dec. 6, 2006, which claims priority to Japanese Patent Application No. 2005-351657, filed on Dec. 6, 2005. The contents of the aforementioned applications are incorporated herein by reference.

FIELD OF THE INVENTION

The present invention relates to: an exposing method and an exposure apparatus that expose a substrate through a liquid; and a device fabricating method.

DESCRIPTION OF RELATED ART

With exposure apparatuses that are used in photolithography, an exposure apparatus is known that adopts a liquid immersion method wherein an optical path space of exposure light is filled with a liquid and a substrate is exposed through that liquid, as disclosed in Japanese Patent Application Publication No. 2005-12201A (corresponding U.S. Patent Application Publication No. 2006/0082744).

When exposing a substrate using a liquid immersion method, the temperature of the liquid of course needs to be set to a desired value; however, the temperature of the object that contacts that liquid must also be set to the desired value. If the temperature of the object that contacts the liquid is not at the desired value, then there is a possibility that, for example, the temperature of the liquid that contacts that object will change or vary. As a result, there is a possibility that exposure failures will occur.

In addition, in cases where the liquid contacts a plurality of objects, it is necessary not only to set the temperature of each object to the desired value, but it is also necessary to set the relationships among the temperatures of all of the objects to desired states. In cases wherein the relationships among the temperatures of all the objects are not in the desired states, there is also a possibility that, for example, the temperature of the liquid will change or vary, or that exposure failures will occur.

A purpose of some aspects of the present invention is to provide an exposing method and an exposure apparatus that can satisfactorily expose a substrate through a liquid.

Another purpose is to provide an exposing method and an exposure apparatus that can prevent exposure failures caused by the temperature of the liquid from occurring and can satisfactorily expose the substrate through the liquid, even if the liquid contacts a plurality of objects.

Yet another purpose is to provide a device fabricating method that uses the exposing method and the exposure apparatus, each of which can satisfactorily expose the substrate through the liquid.

SUMMARY

A first aspect of the invention provides an exposing method that performs an immersion exposure, and comprises: bringing a liquid into contact with an object; recovering the liquid; acquiring information about the temperature of the object using the recovered liquid; and exposing a substrate after the object temperature information is acquired.

According to the first aspect of the invention, it is possible to acquire information about the temperature of the object that contacts the liquid and thereby to expose the substrate satisfactorily through the liquid.

A second aspect of the invention provides an exposing method that performs an immersion exposure, and comprises: adjusting the temperature of at least one of a movable first object, which holds a substrate, and a second object, which is capable of moving independently of the first object, so that a prescribed temperature relationship is achieved between the first object and the second object; and exposing the substrate, which is held by the first object, through a liquid.

According to the second aspect of the invention, it is possible to prevent temperature induced exposure failures from occurring and thereby to expose the substrate satisfactorily through the liquid.

A third aspect of the present invention provides a device fabricating method wherein an exposing method according to the abovementioned aspects is used.

According to the third aspect of the invention, it is possible to fabricate a device using an exposing method that can expose a substrate satisfactorily.

A fourth aspect of the invention provides an immersion exposure apparatus that exposes a substrate, and comprises: a first detection apparatus, which detects the temperature of a liquid after the liquid contacts a prescribed object; and a processing apparatus that detects the relationship between the temperature of the liquid and the temperature of the object based on the detection result of the first detection apparatus.

According to the fourth aspect of the invention, it is possible to acquire information about the temperature of the object that contacts the liquid and thereby to expose the substrate satisfactorily through the liquid.

A fifth aspect of the invention provides an immersion exposure apparatus that exposes a substrate, and comprises: an optical member that emits an exposure beam toward the substrate; a first object that holds the substrate and is capable of moving to a position at which the first object opposes the optical member; a second object that is capable of moving independently of the first object and of moving to a position at which the second object opposes the optical member; and an adjusting apparatus that adjusts the temperature of at least one of the first object and the second object so that the first object and the second object achieve a prescribed temperature relationship.

According to the fifth aspect of the invention, it is possible to prevent temperature induced exposure failures from occurring by setting the temperature relationship between the first object and the second object to a desired state, and thereby to expose the substrate satisfactorily through the liquid.

A sixth aspect of the invention provides an immersion exposure apparatus that exposes a substrate, and comprises: an optical member that emits an exposure beam toward the substrate; a first object that holds the substrate and is capable of moving to a position at which it opposes the optical member; a second object that is capable of moving independently of the first object and moving to a position at which it opposes the optical member and that does not hold the substrate; and an adjusting apparatus that adjusts the temperature of the second object.

According to the sixth aspect of the invention, it is possible to prevent temperature induced exposure failures from occurring and thereby to expose the substrate satisfactorily through the liquid.

A seventh aspect of the present invention provides a device fabricating method wherein an exposure apparatus according to the abovementioned aspects is used.

According to the seventh aspect of the invention, it is possible to fabricate a device using an exposure apparatus that can expose a substrate satisfactorily.

According to the some aspects of the present invention, it is possible to expose a substrate through a liquid satisfactorily, and thereby to fabricate a device that has a desired performance specification.

DESCRIPTION OF EMBODIMENTS

The following explains the embodiments of the present invention referencing the drawings, but the present invention is not limited thereto. Furthermore, the following explanation defines an XYZ orthogonal coordinate system, and the positional relationships among members are explained referencing this system. Prescribed directions within the horizontal plane are the X axial directions, directions that are orthogonal to the X axial directions in the horizontal plane are the Y axial directions, and directions that are orthogonal to the X axial directions and the Y axial directions (i.e., the vertical directions) are the Z axial directions. In addition, the rotational directions around the X, Y, and Z axes (i.e., the inclined directions) are the θX, θY, and θZ directions, respectively.

Figure 1:
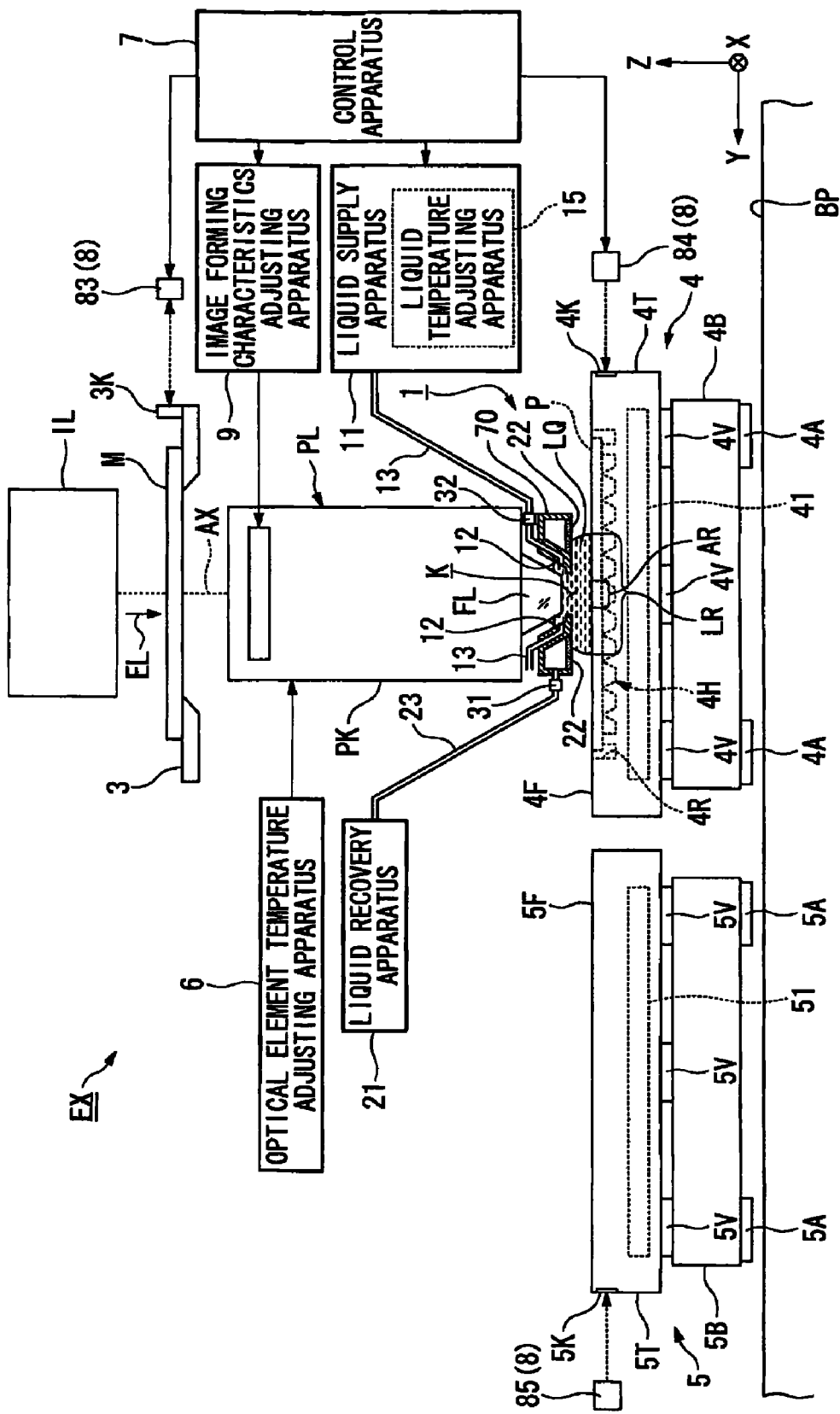
FIG. 1 is a schematic block diagram that shows one embodiment of an exposure apparatus.

FIG. 1 is a schematic block diagram that shows the exposure apparatus EX according to the present embodiment. In FIG. 1, the exposure apparatus EX comprises: a movable mask stage 3 that holds a mask M; a substrate stage 4, which has a substrate holder 4H that holds a substrate P, that is capable of moving on an upper surface of a base member BP while holding the substrate P; a measurement stage 5, which comprises measuring instruments that perform exposure-related measurements, that is capable of moving independently of the substrate stage 4 on the upper surface of the base member BP; a laser interferometer system 8 that is capable of measuring positional information of each stage; an illumination system IL that illuminates the mask M, which is held by the mask stage 3, with exposure light EL; a projection optical system PL, which has a plurality of optical elements through which the exposure light EL passes, that projects an image of a pattern of the mask M, which is illuminated with the exposure light EL, onto the substrate P; and a control apparatus 7 that controls the operation of the entire exposure apparatus EX.

Furthermore, the substrate P described herein includes one wherein a film, such as a photosensitive material (photoresist) or a protective film, is coated on a base material, e.g., a semiconductor wafer. The mask M includes a reticle wherein a device pattern is formed that is reduction projected onto the substrate P. In addition, a transmitting type mask is used as the mask M in the present embodiment, but a reflection type mask may also be used.

The exposure apparatus EX of the present embodiment is a liquid immersion exposure apparatus that employs the liquid immersion method to shorten the exposure wavelength substantially, improve the resolution, and increase the depth of focus substantially, and comprises a liquid immersion system 1 for filling an optical path space K, which is in the optical path of the exposure light EL in the vicinity of the image plane of the projection optical system PL, with a liquid LQ. The control apparatus 7 controls the operation of the liquid immersion system 1. The liquid immersion system 1 fills, with the liquid LQ, the optical path space K of the exposure light EL between a lower surface of a last optical element FL, which is the optical element of the plurality of optical elements of the projection optical system PL that is closest to the image plane of the projection optical system PL, and an object, which is disposed at a position at which it opposes the last optical element FL. For example, during the exposure of the substrate P, the liquid immersion system 1 forms an immersion region LR on the substrate P so that the optical path space K of the exposure light EL between the last optical element FL and the front surface of the substrate P on the substrate stage 4 (the substrate holder 4H), which is capable of moving to a position at which it opposes the last optical element FL, is filled with the liquid LQ. In this case, the liquid LQ that fills the optical path space K contacts the substrate P as well as the last optical element FL. With the present embodiment, water (pure water) is used as the liquid LQ.

The liquid immersion system 1 comprises supply ports 12, which supply the liquid LQ to the optical path space K of the exposure light EL, and a recovery port 22, which recovers the liquid LQ supplied via the supply ports 12 in order to fill the optical path space K of the exposure light EL, and uses the supply ports 12 and the recovery port 22 to fill the optical path space K with the liquid LQ. For example, during the exposure of the substrate P, the recovery port 22 can recover the liquid LQ that contacts the substrate P and the last optical element FL.

The exposure apparatus EX of the present embodiment employs a local liquid immersion system that, during the exposure of the substrate P, uses the liquid LQ that fills the optical path space K of the exposure light EL between the last optical element FL and the substrate P to locally form the immersion region LR, which is larger than a projection region AR of the projection optical system PL and smaller than the substrate P, in part of the area on the substrate P that includes the projection region AR. Furthermore, the liquid immersion system 1 can form the immersion region LR of the liquid LQ not only on the substrate P, but also on an object that is capable of moving to a position at which it opposes the last optical element FL of the projection optical system PL. In the present embodiment, the object that is capable of moving to a position at which it opposes the last optical element FL includes at least one of the substrate stage 4, the substrate P that is held by the substrate stage 4, and the measurement stage 5. Furthermore, the object that is disposed at a position at which it opposes the last optical element FL is not limited to a single object, and there may be a plurality of such objects. Accordingly, the immersion region LR of the liquid LQ may be formed so that it spans a plurality of objects. In addition, the following explanation principally describes a case wherein the last optical element FL and the substrate P are opposing, and the liquid immersion system 1 fills the optical path space K between the last optical element FL and the substrate P with the liquid LQ, but the explanation similarly applies to the case wherein another object opposes the last optical element FL.

The exposure apparatus EX of the present embodiment comprises a first detection apparatus 31 that detects the temperature of the liquid LQ after it contacts the substrate P and the last optical element FL. In the present embodiment, the first detection apparatus 31 detects the temperature of the liquid LQ that is recovered via the recovery port 22.

In addition, the exposure apparatus EX of the present embodiment comprises second detection apparatuses 32, which detect the temperature of the liquid LQ that is supplied to the supply ports 12. The second detection apparatuses 32 detect the temperature of the liquid LQ before it is supplied to the optical path space K via the supply ports 12, i.e., the temperature of the liquid LQ before it contacts the substrate P and the last optical element FL.

At least during the projection of the image of the pattern of the mask M onto the substrate P, the exposure apparatus EX uses the liquid immersion system 1 to fill the optical path space K of the exposure light EL with the liquid LQ. In order to expose the substrate P, the exposure apparatus EX projects the image of the pattern of the mask M onto the substrate P by radiating the exposure light EL that passes through the mask M onto the substrate P, which is held by the substrate holder 4H, through the projection optical system PL and the liquid LQ of the immersion region LR, which is formed so that it fills the optical path space K of the exposure light EL.

The illumination system IL illuminates a prescribed illumination area on the mask M with the exposure light EL, which has a uniform luminous flux intensity distribution. Examples of light that can be used as the exposure light EL emitted from the illumination system IL include: deep ultraviolet (DUV) light such as bright line (g-line, h-line, or i-line) light emitted from, for example, a mercury lamp and KrF excimer laser light (248 nm wavelength); and vacuum ultraviolet (VUV) light such as ArF excimer laser light (193 nm wavelength) and $F_2$ laser light (157 nm wavelength). ArF excimer laser light is used as the exposure light EL in the present embodiment.

The mask stage 3, in a state wherein it holds the mask M, is movable in the X axial, Y axial, and θZ directions by a mask stage drive apparatus that comprises actuators, e.g., linear motors. Mask stage interferometers 83 of the laser interferometer system 8 measure the positional information of the mask stage 3 (and, in turn, the mask M). The laser interferometers 83 use reflecting mirrors 3K, which are provided on the mask stage 3, to measure the positional information of the mask stage 3. The control apparatus 7 controls the mask stage drive apparatus based on the measurement results of the laser interferometers 83 so as to control the position of the mask M, which is held by the mask stage 3.

Furthermore, the reflecting mirrors 3K need not simply be plane mirrors, but may include corner cubes (retroreflectors); furthermore, it is acceptable to form, for example, reflecting surfaces by mirror polishing end surfaces (side surfaces) of the mask stage 3 instead of providing the reflecting mirrors 3K so that they are fixed to the mask stage 3. In addition, the mask stage 3 may be configured so that it is coarsely and finely movable, as disclosed in, for example, Japanese Patent Application Publication No. H8-130179A (corresponding U.S. Pat. No. 6,721,034).

The projection optical system PL is a system that projects an image of the pattern of the mask M to the substrate P at a prescribed projection magnification. The optical elements of the projection optical system PL are held by a lens barrel PK. The projection optical system PL of the present embodiment is a reduction system, the projection magnification of which is, for example, ¼, ⅕, or ⅛, and forms a reduced image of the pattern of the mask M in the projection region AR, which is optically conjugate with the illumination area discussed above. Furthermore, the projection optical system PL may be a reduction system, a unity magnification system, or an enlargement system. In the present embodiment, an optical axis AX of the projection optical system PL is parallel to the Z axial directions. In addition, the projection optical system PL may be: a dioptric system that does not include catoptric elements; a catoptric system that does not include dioptric elements; or a catadioptric system that includes both catoptric elements and dioptric elements. In addition, the projection optical system PL may form either an inverted image or an erect image.

The projection optical system PL is provided with an image forming characteristics adjusting apparatus 9 that is capable of adjusting the image forming characteristics of the projection optical system PL, as disclosed in, for example, Japanese Patent Application Publication No. S60-78454A (corresponding U.S. Pat. No. 4,666,273), Japanese Patent Application Publication No. H11-195602A (corresponding U.S. Pat. No. 6,235,438, and PCT International Publication WO03/65428 (corresponding U.S. Patent Application Publication No. 2005/0206850). The image forming characteristics adjusting apparatus 9 comprises an optical element drive apparatus, which is capable of moving some of the optical elements of the plurality of optical elements of the projection optical system PL. The optical element drive apparatus can, for example, move specific optical elements of the plurality of optical elements of the projection optical system PL in the directions of the optical axis AX (in the Z axial directions), and can also incline them with respect to the optical axis AX. By moving specific optical elements of the projection optical system PL, the image forming characteristics adjusting apparatus 9 can adjust the image forming characteristics of the projection optical system PL, including various aberrations (projection magnification, distortion, spherical aberration, and the like) and the image plane position (the focal point position). In addition, a pressure adjusting apparatus that adjusts the pressure of a gas in spaces between some of the optical elements that are held inside the lens barrel PK can also be provided as the image forming characteristics adjusting apparatus 9. The control apparatus 7 controls the image forming characteristics adjusting apparatus 9.

In addition, the projection optical system PL is provided with a temperature adjusting apparatus 6 that is capable of adjusting at least one of the temperature of the plurality of optical elements of the projection optical system PL and the temperature of the spaces between the optical elements. The temperature adjusting apparatus 6 can also adjust the temperature of the last optical element FL, which is the optical element of the plurality of optical elements of the projection optical system PL that is closest to the image plane of the projection optical system PL.

The substrate stage 4 comprises: a stage main body 4B; a substrate table 4T, which is mounted on the stage main body 4B; and a substrate holder 4H, which is provided to the substrate table 4T and detachably holds the substrate P. In the present embodiment, the substrate holder 4H is disposed in a recessed part 4R, which is provided on the substrate table 4T. An upper surface 4F, which is provided so that it surrounds the recessed part 4R of the substrate table 4T, is a flat surface that is substantially the same height as (flush with) the front surface of the substrate P, which is held by the substrate holder 4H. Furthermore, there may be a level difference between the front surface of the substrate P, which is held by the substrate holder 4H, and the upper surface 4F of the substrate table 4T. Furthermore, part of the upper surface 4F of the substrate stage 4, e.g., just a prescribed area that surrounds the substrate P, may be at substantially the same height as the front surface of the substrate P. In addition, in the present embodiment, the substrate holder 4H and the substrate stage 4 are configured separately, and the substrate holder 4H is fixed to the recessed part 4R of the substrate stage 4 by, for example, vacuum chucking; however, the substrate holder 4H may be formed integrally with the substrate stage 4.

The stage main body 4B is noncontactually supported by air bearings 4A with respect to the upper surface (guide surface) of the base member BP. The upper surface of the base member BP is substantially parallel to the XY plane, and the substrate stage 4 is capable of moving on the base member BP in the X and Y directions.

The substrate stage 4 can be moved on the base member BP by a substrate stage drive apparatus, which comprises actuators such as linear motors, in the state wherein the substrate holder 4H holds the substrate P. The substrate stage drive apparatus comprises: a first drive system that is capable of moving the substrate table 4T, which is mounted on the stage main body 4B, in the X axial, the Y axial, and the θZ directions by moving the stage main body 4B on the base member BP in the X axial, the Y axial, and the θZ directions; and a second drive system, which is capable of moving the substrate table 4T in the Z axial, the θX, and the θY directions with respect to the stage main body 4B.

The first drive system comprises actuators such as linear motors. The second drive system comprises: actuators 4V, such as voice coil motors, that are interposed between the stage main body 4B and the substrate table 4T; and a measuring apparatus (e.g., an encoder; not shown) that measures the amount of drive of each of the actuators 4V. The substrate table 4T is supported on the stage main body 4B by at least three actuators 4V Each of the actuators 4V can drive the substrate table 4T independently in the Z axial directions with respect to the stage main body 4B. The control apparatus 7 drives the substrate table 4T in the Z axial, the θX, and the θY directions with respect to the stage main body 4B by adjusting the amount of drive of each of the three actuators 4V. Thus, the substrate stage drive apparatus, which includes the first and second drive systems, is capable of moving the substrate table 4T of the substrate stage 4 with six degrees of freedom, i.e., in the X axial, the Y axial, the Z axial, the θX, the θY, and the θZ directions. By controlling the substrate stage drive apparatus, the control apparatus 7 can control the position of the front surface of the substrate P, which is held by the substrate holder 4H of the substrate table 4T, with six degrees of freedom, i.e., in the X axial, the Y axial, the Z axial, the θX, the θY, and the θZ directions.

Laser interferometers 84 of the laser interferometer system 8 measure the positional information of the substrate table 4T of the substrate stage 4 (and, in turn, the substrate P). The laser interferometers 84 use reflecting mirrors 4K, which are provided to the substrate table 4T, to measure the positional information of the substrate table 4T in the X axial, the Y axial, and the θZ directions. In addition, a focus and level detection system (not shown) detects the surface position information (positional information in the Z axial, the θX, and the θY directions) of the front surface of the substrate P, which is held by the substrate holder 4H of the substrate table 4T. Based on the measurement results of the laser interferometers 84 and the detection results of the focus and level detection system, the control apparatus 7 controls the position of the substrate P, which is held by the substrate holder 4H, by driving the substrate stage drive apparatus.

The focus and level detection system detects inclination information (the rotational angle) of the substrate P in the θX and the θY directions by measuring the positional information of the substrate P in the Z axial directions at a plurality of measurement points. Furthermore, if, for example, the laser interferometers 84 are capable of measuring the positional information of the substrate P in the Z axial, the θX, and the θY directions, then the focus and level detection system does not need to be provided so that the positional information of the substrate P can be measured in the Z axial directions during the exposure operation, and the position of the substrate P in the Z axial, the θX, and the θY directions may be controlled using the measurement results of the laser interferometers 84 at least during the exposure operation.

The measurement stage 5 comprises: a stage main body 5B; a measurement table 5T, which is mounted on the stage main body 5B; and measuring instruments, which are provided to the measurement table 5T and perform exposure-related measurements. The stage main body 5B is noncontactually supported by air bearings 5A with respect to the upper surface (guide surface) of the base member BP. The upper surface of the base member BP is substantially parallel to the XY plane, and the measurement stage 5 is capable of moving on the base member BP in the X and Y directions.

The measurement stage 5 can be moved on the base member BP by a measurement stage drive apparatus, which comprises actuators such as linear motors, in the state wherein the measuring instruments are mounted to the measurement table 5T. The measurement stage drive apparatus comprises: a first drive system that is capable of moving the measurement table 5T, which is mounted on the stage main body 5B, in the X axial, the Y axial, and the θZ directions by moving the stage main body 5B in the X axial, the Y axial, and the θZ directions on the base member BP; and a second drive system, which is capable of moving the measurement table 5T in the Z axial, the θX, and the θY directions with respect to the stage main body 5B. The first drive system comprises actuators such as linear motors. The second drive system comprises: actuators 5V, such as voice coil motors, that are interposed between the stage main body 5B and the measurement table 5T; and a measuring apparatus (e.g., an encoder; not shown) that measures the amount of drive of each of the actuators 5V. The control apparatus 7 can control the position of the measurement table 5T, whereon the measuring instruments are mounted, with six degrees of freedom by controlling the measurement stage drive apparatus. In addition, laser interferometers 85 of the laser interferometer system 8 measure the positional information of the measurement table 5T of the measurement stage S. The laser interferometers 85 use reflecting mirrors 5K, which are provided to the measurement table 5T, to measure the positional information of the measurement table 5T in the X axial, the Y axial, and the θZ directions. The control apparatus 7 controls the position of the measurement stage 5 (the measurement table 5T) based on the measurement results of the laser interferometers 85. Furthermore, an exposure apparatus that comprises a substrate stage, which holds a substrate P, and a measurement stage, which comprises measuring instruments, are disclosed in, for example, Japanese Patent Application Publication No. H11-135400A, Japanese Patent Application Publication No. 2000-164504A, and U.S. Pat. No. 6,897,963.

Thus, the substrate stage 4, which comprises the substrate table 4T, is capable of moving while holding the substrate P within an XY plane on the image plane side of the projection optical system PL. The measurement stage 5, which comprises the measurement table 5T, can move independently of the substrate stage 4 within an XY plane on the image plane side of the projection optical system PL. In addition, the substrate stage drive apparatus can move the immersion region LR and the substrate table 4T, which includes the substrate P, relative to one another. The measurement stage drive apparatus can move the immersion region LR and the measurement table 5T relative to one another.

In addition, in the present embodiment, the exposure apparatus EX comprises a first temperature adjusting apparatus 41 that is capable of adjusting the temperature of the substrate table 4T. In the present embodiment, the first temperature adjusting apparatus 41 is provided inside the substrate table 4T. The control apparatus 7 can adjust the temperature of the substrate table 4T, including the upper surface 4F, using the first temperature adjusting apparatus 41. The first temperature adjusting apparatus 41 can adjust the temperature of the substrate holder 4H by adjusting the temperature of the substrate table 4T. In addition, adjusting the temperature of the substrate holder 4H also adjusts the temperature of the substrate P that is held by the substrate holder 4H. Namely, the first temperature adjusting apparatus 41 can adjust the temperature of the upper surface 4F of the substrate table 4T and the temperature of the substrate P so that they are substantially the same by adjusting the temperature of the substrate table 4T, which comprises the substrate holder 4H that holds the substrate P.

In addition, in the present embodiment, the exposure apparatus EX comprises a second temperature adjusting apparatus 51, which is capable of adjusting the temperature of the measurement table 5T. In the present embodiment, the second temperature adjusting apparatus 51 is provided inside the measurement table 5T. The control apparatus 7 can adjust the temperature of the measurement table 5T, including an upper surface 5F, using the second temperature adjusting apparatus 51.

The first temperature adjusting apparatus 41 and the second temperature adjusting apparatus 51 of the present embodiment can adjust the temperature of the substrate table 4T and the temperature of the measurement table 5T, respectively, by flowing the liquid, the temperature of which has been adjusted, to passageways that are provided to the substrate table 4T and the measurement table 5T. Furthermore, the temperatures may be adjusted using a Peltier element or a heater in addition to or instead of flowing the liquid to adjust the temperatures.

The liquid immersion system 1 comprises: a nozzle member 70, which is provided in the vicinity of the optical path space K of the exposure light EL between the last optical element FL and the substrate P and comprises the supply ports 12 and the recovery port 22; a liquid supply apparatus 11 that supplies the liquid LQ to the supply ports 12 via supply pipes 13 and supply passageways, which are formed inside the nozzle member 70; and a liquid recovery apparatus 21 that recovers the liquid LQ recovered from the recovery port 22 of the nozzle member 70 via a recovery passageway, which is formed inside the nozzle member 70, and a recovery pipe 23. In the present embodiment, the nozzle member 70 is annularly provided so that it surrounds the optical path space K of the exposure light EL. The supply ports 12 that supply the liquid LQ are provided in an inner side surface of the nozzle member 70 that faces the optical path space K of the exposure light EL. The recovery port 22 that recovers the liquid LQ is provided to a lower surface of the nozzle member 70 that opposes the front surface of the substrate P. In addition, in the present embodiment, a porous member (mesh) is disposed in the recovery port 22.

The liquid supply apparatus 11 comprises: a liquid temperature adjusting apparatus 15, which adjusts the temperature of the liquid LQ that is to be supplied; a degasifier that reduces a gas component in the liquid LQ; and a filter unit, which eliminates foreign matter in the liquid LQ; and is capable of feeding the liquid LQ, which is pure and the temperature of which has been adjusted. In addition, the liquid recovery apparatus 21 comprises, for example, a vacuum system and is capable of recovering the liquid LQ. After the liquid LQ that is fed from the liquid supply apparatus 11 flows through the supply pipes 13 and the supply passageways of the nozzle member 70, it is supplied to the optical path space K of the exposure light EL (on the substrate P) via the supply ports 12. In addition, the liquid LQ that is recovered via the recovery port 22 by operating the liquid recovery apparatus 21 flows through the recovery passageway of the nozzle member 70 and is then recovered by the liquid recovery apparatus 21 via the recovery pipe 23. The control apparatus 7 forms the immersion region LR of the liquid LQ on the substrate P so that the optical path space K of the exposure light EL between the last optical element FL and the substrate P is filled with the liquid LQ by controlling the liquid immersion system 1 so that the liquid supply operation with the liquid supply apparatus 11 and the liquid recovery operation with the liquid recovery apparatus 21 are performed in parallel.

In the present embodiment, the first detection apparatus 31 is provided at a prescribed position of the recovery pipe 23, and detects the temperature of the liquid LQ that is recovered via the recovery port 22. The detection results of the first detection apparatus 31 are output to the control apparatus 7.

In addition, in the present embodiment, the second detection apparatuses 32 are provided at prescribed positions of the supply pipes 13 and detect the temperature of the liquid LQ, the temperature of which has been adjusted by the liquid temperature adjusting apparatus 15 of the liquid supply apparatus 11, before it is supplied via the supply ports 12, i.e., the temperature of the liquid LQ before it is supplied to the optical path space K. The detection results of the second detection apparatuses 32 are output to the control apparatus 7.

Figure 2:
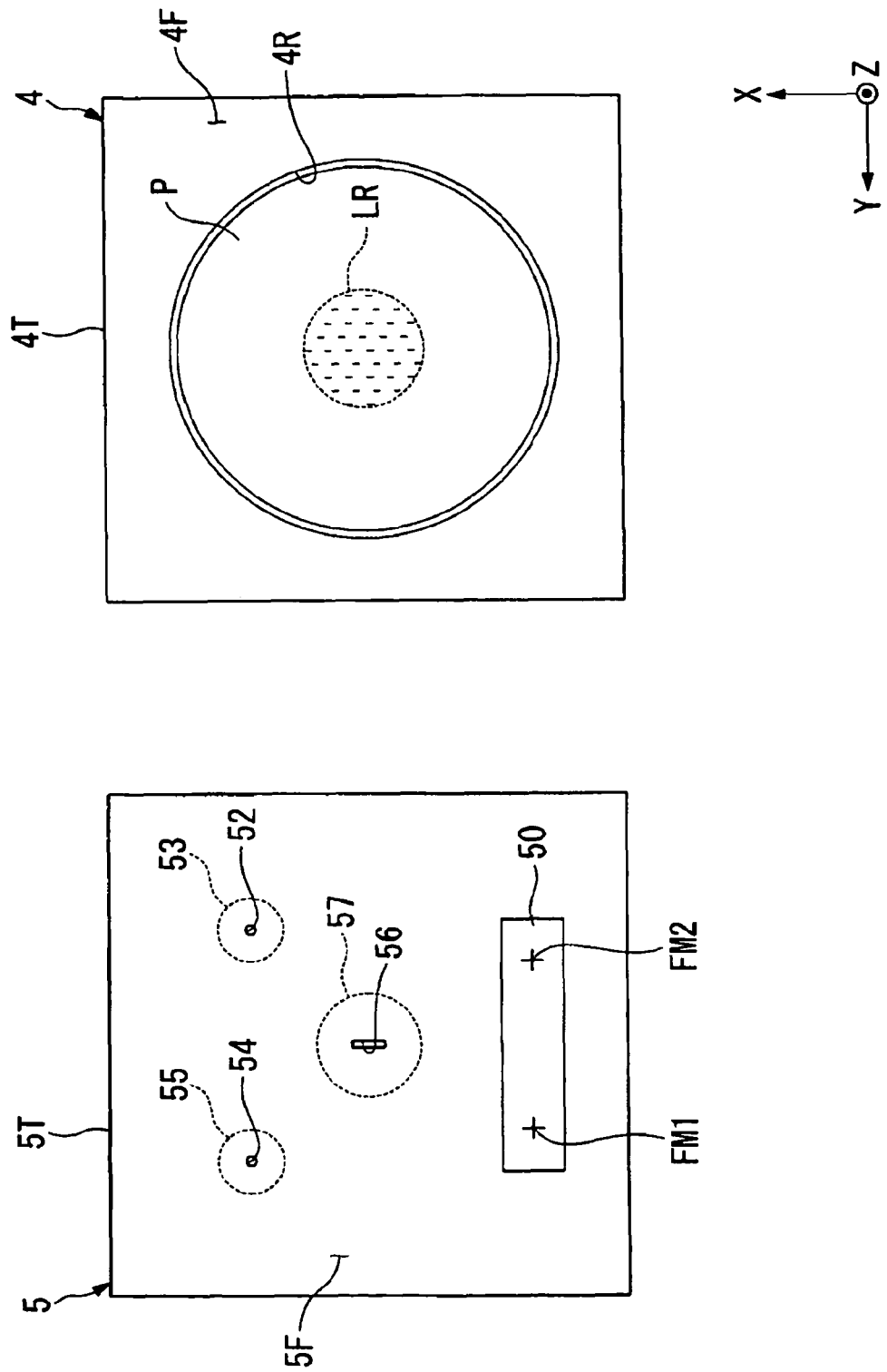
FIG. 2 is a plan view of a substrate table and a measurement table, viewed from above.

FIG. 2 is a plan view of the substrate table 4T and the measurement table 5T, viewed from above. A fiducial plate 50, wherein first and second fiducial marks FM1, FM2 are formed that are used in a process (an alignment process) that acquires information in order to align a projection position of the image if the pattern and a shot region on the substrate P, is provided as a measuring instrument (a measuring member) at a prescribed position on the upper surface 5F of the measurement table 5T. In the present embodiment, the first fiducial mark FM1 is measured by a visual reticle alignment (VRA) system, which is a through-the-reticle (TTR) alignment system that uses light of the exposure wavelength as disclosed in, for example, Japanese Patent Application Publication No. H7-176468A (corresponding U.S. Pat. No. 5,646,413), that detects the mark position by radiating light to the mark, and then image processing the image data of the mark, which is captured by, for example, a CCD camera. In addition, the second fiducial mark FM2 is measured by a field image alignment (FIA) system, which is an off-axis type alignment system as disclosed in, for example, Japanese Patent Application Publication No. H4-65603A (corresponding U.S. Pat. No. 5,493,403), that measures the position of the mark by: irradiating a target mark (e.g., an alignment mark formed on the substrate P, the second fiducial mark FM2 formed on the fiducial plate 50, etc.) with a broadband detection light beam that does not photosensitize the photosensitive material on the substrate P; using an image capturing device (e.g., a CCD) to capture an image of an index (an index mark on an index plate that is provided in an alignment system) and an image of the target mark that is imaged on a light receiving surface by the light reflected from that target mark; and image processing these image capturing signals.

In addition, a first opening 52 is formed at a prescribed position of the upper surface 5F of the measurement table 5T. A wavefront aberration measuring instrument 53 is disposed below (in the −Z direction of) the first opening 52. The wavefront aberration measuring instrument 53 comprises a microlens array and a light receiving device, such as a CCD, uses the microlens array to split the wavefront of the exposure light EL that passes through the first opening 52 via the projection optical system PL, and measures the wavefront aberration of the projection optical system PL from the positions at which the split wavefront form images on the light receiving device. The wavefront aberration measuring instrument disclosed in, for example, PCT International Publication WO99/60361 (corresponding European Patent No. 1,079,223) can be used as the wavefront aberration measuring instrument 53.

In addition, a second opening 54 is formed at a prescribed position of the upper surface 5F of the measurement table 5T. An exposure light measuring instrument 55, which measures information (for example, the amount of light, the luminous flux intensity, and the luminous flux intensity nonuniformity) related to the exposure energy of the exposure light EL that is radiated onto the measurement table 5T through the projection optical system PL, is disposed below (in the −Z direction of) the second opening 54. Measuring instruments that can be used as the exposure light measuring instrument 55 include: a measuring instrument that measures luminous flux intensity nonuniformity, as disclosed in, for example, Japanese Patent Application Publication No. S57-117238A (corresponding U.S. Pat. No. 4,465,368); a measuring instrument that measures the amount of fluctuation in the transmittance of the exposure light EL of the projection optical system PL, as disclosed in, for example, Japanese Patent Application Publication No. 2001-267239A (corresponding U.S. Pat. No. 6,721,039); and an irradiance measuring instrument (luminous flux intensity measuring instrument), as disclosed in, for example, Japanese Patent Application Publication No. H11-16816A (corresponding U.S. Patent Application Publication No. 2002/0061469).

In addition, a third opening 56 is formed at a prescribed position of the upper surface 5F of the measurement table 5T. An aerial image measuring instrument 57, which measures the image forming characteristics (optical characteristics) of the projection optical system PL, as disclosed in, for example, Japanese Patent Application Publication No. 2002-14005A, Japanese Patent Application Publication No. 2002-198303A, and U.S. Patent Application Publication No. 2002/0041377, is disposed below (in the −Z direction of) the third opening 56.

Furthermore, an observation apparatus (an observation camera) that comprises an image capturing device, such as a CCD, and that is capable of observing the state of the immersion region LR can be provided to the measurement table 5T.

Figure 3:
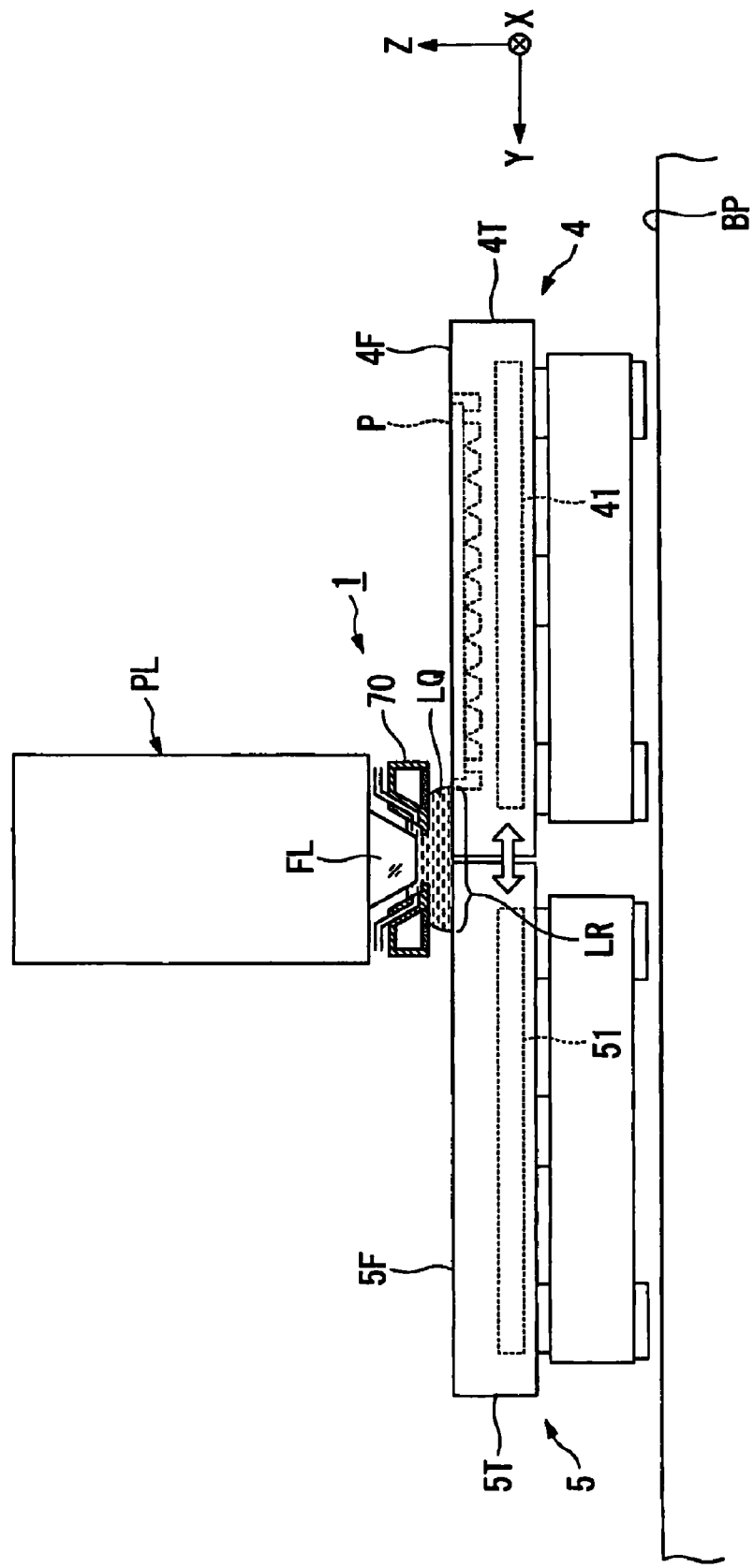
FIG. 3 is for explaining one example of the operation of a substrate stage and a measurement stage.

FIG. 3 is a schematic drawing for explaining one example of the operation of the substrate stage 4 and the measurement stage 5. As shown in FIG. 3, the substrate stage 4 and the measurement stage 5 can move on the image plane side of the projection optical system PL. The control apparatus 7 can move the immersion region LR, which is formed by the liquid immersion system 1, between the upper surface 4F of the substrate table 4T and the upper surface 5F of the measurement table 5T by moving the substrate stage 4 and the measurement stage 5 together in the X and Y directions in a state wherein the upper surface 4F of the substrate table 4T and the upper surface 5F of the measurement table 5T are brought into close proximity or contact within a prescribed area that includes a position that is directly below the projection optical system PL. The control apparatus 7, for example, forms the immersion region LR of the liquid LQ on the measurement table 5T with a prescribed timing and performs a prescribed measurement using the various measuring instruments discussed above as needed.

The following explains a method of using the exposure apparatus EX that has the abovementioned configuration to expose the substrate P.

As discussed above, when the substrate P is exposed, the optical path space K of the exposure light EL between the last optical element FL of the projection optical system PL and the substrate P is filled with the liquid LQ, which contacts both the substrate P and the last optical element FL. In order to prevent an exposure failure from occurring and to project the image of the pattern of the mask M onto the substrate P in a desired projection state, it is preferable to prevent the temperature of the liquid LQ that fills the optical path space K from changing or varying and maintain the temperature of the liquid LQ that fills the optical path space K at a desired value. In order to maintain the temperature of the liquid LQ that fills the optical path space K at a desired value, it is preferable to make the temperature of the liquid LQ that fills the optical path space K, the temperature of the substrate P that contacts that liquid LQ, and the temperature of the last optical element FL substantially coincide.

In addition, as was explained referencing FIG. 3, the immersion region LR of the liquid LQ, which is formed so that it fills the optical path space K, moves between the upper surface 4F of the substrate table 4T and the upper surface 5F of the measurement table 5T, and the liquid LQ contacts both the substrate table 4T and the measurement table 5T. To maintain the temperature of the liquid LQ that fills the optical path space K at the desired value, it is preferable to make the temperature of the liquid LQ that fills the optical path space K, the temperature of the upper surface 4F of the substrate table 4T, which the liquid LQ contacts, and the temperature of the upper surface 5F of the measurement table 5T substantially coincide.

Making the temperature of the liquid LQ that contacts the optical path space K, the temperature of the upper surface 4F of the substrate table 4T, which contacts that liquid LQ, the temperature of the upper surface 5F of the measurement table 5T, and the temperature of the substrate P substantially coincide makes it possible to expose the substrate P, which is held by the substrate table 4T, satisfactorily, and to also perform high-precision measurements using the measurement stage 5.

Accordingly, in the present embodiment, before the substrate P is exposed, a process is performed that makes the temperature of the liquid LQ, the temperature of the upper surface 4F of the substrate table 4T, including the front surface of the substrate P, the temperature of the last optical element FL, and the temperature of the upper surface 5F of the measurement table 5T substantially coincide.

Figure 4:
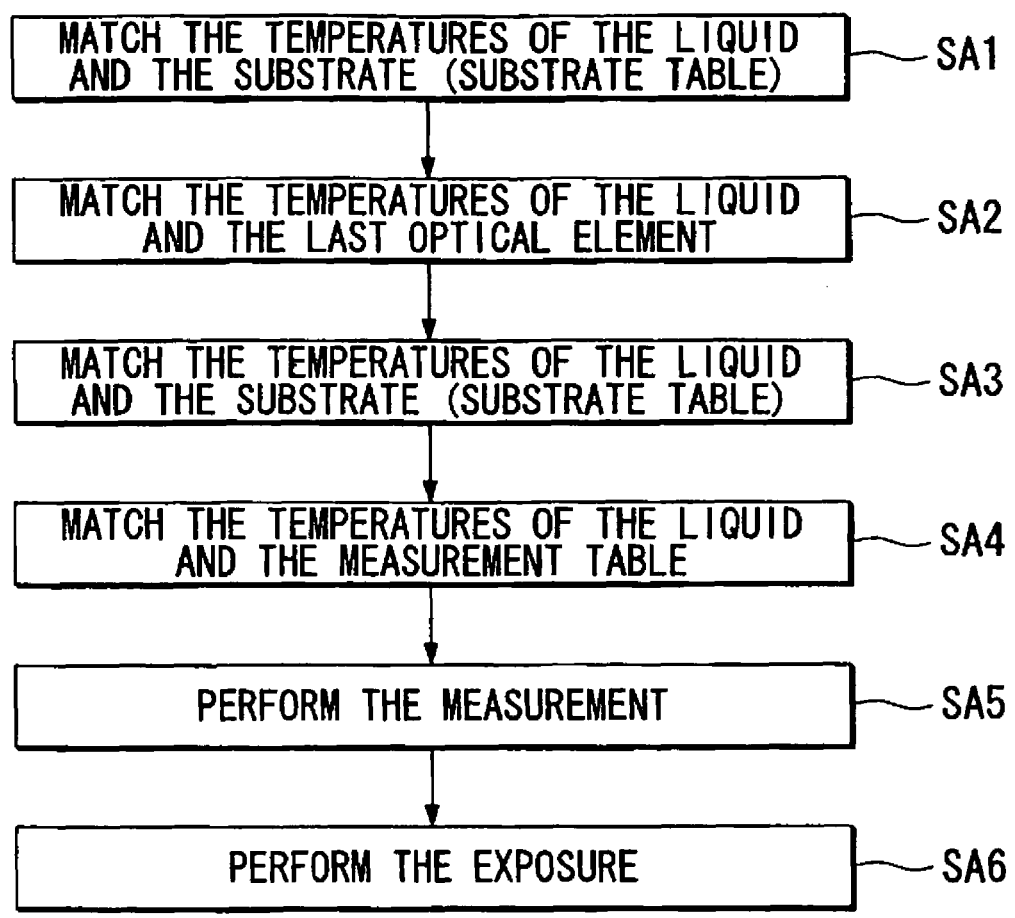
FIG. 4 is a flow chart diagram for explaining one embodiment of an exposing method.

The following principally explains a processing procedure that makes the temperature of the liquid LQ that fills the optical path space K, the temperature of the upper surface 4F of the substrate table 4T, including the front surface of the substrate P, the temperature of the last optical element FL, and the temperature of the upper surface 5F of the measurement table 5T substantially coincide. FIG. 4 is a flow chart diagram that depicts the processing procedure according to the present embodiment.

In the present embodiment, the control apparatus 7 uses the first detection apparatus 31 to detect the temperature of the liquid LQ that is recovered via the recovery port 22, and, based on that detection result, acquires the relationship between the temperature of the liquid LQ and the temperature of the objects that contact the liquid LQ. Namely, the control apparatus 7 determines, based on the detection result of the first detection apparatus 31, whether the temperature of the liquid LQ and the temperature of the substrate P (the substrate table 4T) are the same, whether the temperature of the liquid LQ and the temperature of the last optical element FL are the same, or whether the temperature of the liquid LQ and the temperature of the measurement table 5T are the same. Specifically, if the temperature of the liquid LQ that is supplied via the supply ports 12 and the temperature of the liquid LQ that is recovered via the recovery port 22 are the same, then it is determined that the temperature of the liquid LQ and the temperature of the objects (e.g., the substrate P) that the liquid LQ contacts are substantially the same; furthermore, if the former temperatures are different, then it is determined that the latter temperatures are different. Furthermore, the temperature of the liquid LQ to be supplied can be detected by using the second detection apparatuses 32; however, the target temperature of the liquid LQ, which is the adjustment target of the liquid temperature adjusting apparatus 15, can also be used. Moreover, in order to make the abovementioned determinations with higher precision, the temperature of the liquid LQ that is recovered via the recovery port 22 may be detected while varying the detection conditions, and any and all of the abovementioned determinations may be made based on that plurality of detection conditions. Here, the detection conditions include the relative positional relationship between the immersion region LR and any one of the objects (at least one of the substrate P and the tables 4T, 5T). In addition, the detection conditions include the supply quantity that is used when the liquid LQ is supplied onto the objects (at least one of the substrate P and the tables 4T, 5T). The control apparatus 7 performs a prescribed process based on the result of the determination of whether the temperature of the liquid LQ and the temperature of the objects (the substrate P, the last optical element FL, and the tables 4T, 5T) that the liquid LQ contacts are the same, and then exposes the substrate P.

First, the substrate P is loaded on the substrate holder 4H of the substrate table 4T. The substrate P is held by the substrate holder 4H. The first temperature adjusting apparatus 41 adjusts the temperature of the substrate table 4T, including the substrate holder 4H, to a prescribed temperature in advance. In addition, the temperature adjusting apparatus 6 adjusts the temperature of the last optical element FL to a prescribed temperature in advance. The substrate P is held by the substrate holder 4H for a prescribed time (e.g., 20 min.), and thereby its temperature becomes substantially the same as the temperature of the substrate table 4T, including the substrate holder 4H. Namely, the substrate holder 4H of the substrate table 4T continues to hold the substrate P for the prescribed time, and therefore the temperature of the substrate table 4T and the temperature of the substrate P reach a state of equilibrium, i.e., the temperature of the substrate table 4T and the temperature of the substrate P substantially coincide, and the temperature of the front surface of the substrate P and the temperature of the upper surface 4F of the substrate table 4T substantially coincide.

Furthermore, the prescribed time (e.g., 20 min.) that is needed to make the temperature of the substrate P and the temperature of the substrate table 4T substantially coincide after the substrate P is held by the substrate holder 4H (after the substrate P is loaded onto the substrate holder 4H) can be derived in advance, for example, empirically or by simulation.

Furthermore, a substrate temperature adjusting apparatus, which is capable of adjusting the temperature of the substrate P, can be provided along a transport pathway of the substrate P, and can be used to adjust the temperature of the substrate P before it is loaded on the substrate holder 4H. Thereby, it is possible to reduce the prescribed time needed to make the temperature of the substrate P and the temperature of the substrate table 4T substantially coincide, as well as to prevent the deformation of the substrate P caused by a change in temperature in the course of being held by the substrate table 4T.

After the prescribed time that the substrate P is to be held by the substrate holder 4H elapses and the temperatures of the substrate P and the substrate table 4T, including the substrate holder 4H, have been made to substantially coincide, the control apparatus 7 starts a process (step SA1) that matches the temperature of the liquid LQ for forming the immersion region LR on the substrate P and the temperature of the upper surface 4F of the substrate table 4T, including the front surface of the substrate P.

First, after the prescribed time that the substrate P is to be held by the substrate holder 4H elapses, i.e., after the temperature of the upper surface 4F of the substrate table 4T and the temperature of the front surface of the substrate P substantially coincide, the control apparatus 7 starts the operation wherein the liquid immersion system 1 is used to form the immersion region LR of the liquid LQ on the substrate P. The control apparatus 7 forms the immersion region LR of the liquid LQ on the substrate P by controlling the liquid immersion system 1 so as to supply the liquid LQ at a prescribed supply quantity per unit of time onto the substrate P via the supply ports 12, and to recover the liquid LQ at a prescribed recover quantity per unit of time via the recovery port 22 in accordance with the quantity of liquid supplied via the supply ports 12.

As discussed above, in the present embodiment, the liquid immersion system 1 locally forms the immersion region LR of the liquid LQ in part of the area of the substrate P.

The liquid temperature adjusting apparatus 15 adjusts the temperature of the liquid LQ that is supplied onto the substrate P via the supply ports 12 to a first value (e.g., 23° C.). In addition, the first temperature adjusting apparatus 41 adjusts the temperatures of the front surface of the substrate P, which is held by the substrate holder 4H, and the upper surface 4F of the substrate table 4T using the first value as a target value. In addition, the temperature adjusting apparatus 6 also adjusts the temperature of the last optical element FL using the first value as the target value. In addition, the second detection apparatuses 32 monitor (measure) the temperature of the liquid LQ that is supplied via the supply ports 12, and the first detection apparatus 31 monitors (measures) the temperature of the liquid LQ that is recovered via the recovery port 22.

The control apparatus 7 performs the operation of recovering the liquid LQ via the recovery port 22 of the liquid immersion system 1 while using the substrate stage 4 to move the substrate P in the X and Y directions with respect to the immersion region LR, and detects the temperature of the recovered liquid LQ using the first detection apparatus 31.

Based on the detection result of the first detection apparatus 31 and the detection results of the second detection apparatuses 32, the control apparatus 7 determines whether the temperature of the liquid LQ and the temperature of the upper surface 4F of the substrate table 4T, including the front surface of the substrate P, are the same.

If the liquid temperature adjusting apparatus 15 adjusts the temperature of the liquid LQ with high precision, then the detection results of the second detection apparatuses 32 do not vary substantially because the temperature of the liquid LQ that is supplied via the supply ports 12 does not vary substantially.

If there is a temperature differential between the substrate P and the liquid LQ that is supplied onto the substrate P via the supply ports 12, then the detection results of the first detection apparatus 31 will fluctuate. Moreover, if there is substantially no temperature differential between the substrate P and the liquid LQ that is supplied onto the substrate P via the supply ports 12, then the detection results of the first detection apparatus 31 will substantially not fluctuate. This will now be explained, referencing FIGS. 5A-5C and FIGS. 6A-6C.

Figure 5A:
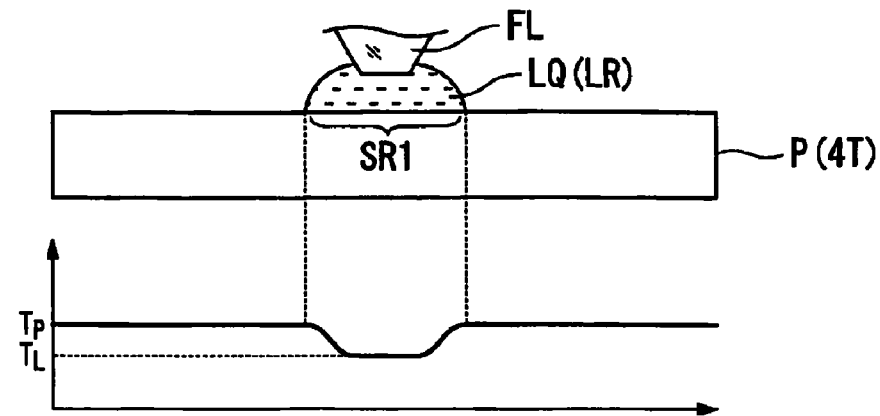
FIG. 5A is a schematic drawing for explaining the temperature distribution of a front surface of a substrate in relation to the positional relationship between an immersion region and the substrate.
Figure 5B:
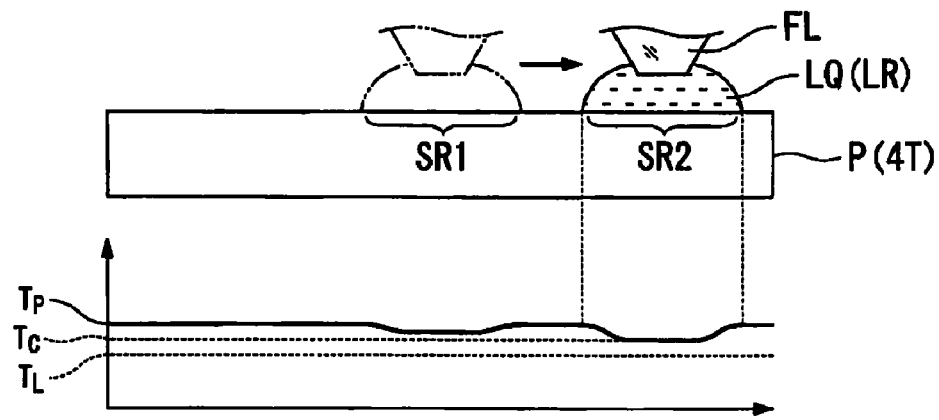
FIG. 5B is a schematic drawing for explaining the temperature distribution of the substrate front surface in relation to the positional relationship between the immersion region and the substrate.
Figure 5C:
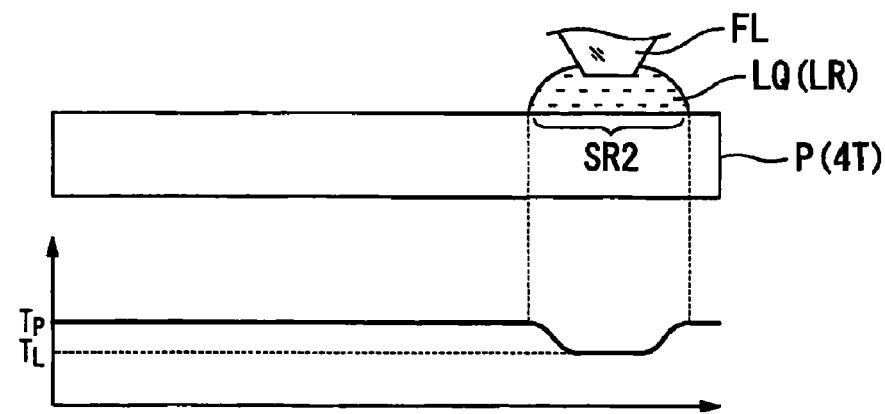
FIG. 5C is a schematic drawing for explaining the temperature distribution of the substrate front surface in relation to the positional relationship between the immersion region and the substrate.

FIGS. 5A-5C schematically show the temperature distributions of the front surface of the substrate P and the upper surface 4F of the substrate table 4T in relation to the positional relationship between the immersion region LR and the substrate P when there is a temperature differential between the liquid LQ and the upper surface 4F of the substrate table 4T, including the front surface of the substrate P. In FIGS. 5A-5C, the temperature of the liquid LQ that is supplied via the supply ports 12 is adjusted to a first value $T_L$. However, even though the first temperature adjusting apparatus 41 adjusts the temperature of the substrate table 4T (and, in turn, the substrate P) using the first value $T_L$ as a target value, there is a possibility that the temperature of the front surface of the substrate P (the upper surface 4F of the substrate table 4T) will differ from the first value $T_L$ for some reason, e.g., due to the effect of an air conditioning system or the effect of heat generating bodies such as the various drive apparatuses, and become, for example, a second value $T_P$ that is higher than the first value $T_L$.

For example, let us consider a case wherein the immersion region LR is formed on part of the substrate P using the liquid immersion system 1 in the state wherein the relative position between the immersion region LR and the substrate P is substantially fixed, i.e., in the state wherein the position of the substrate table 4T in the X and Y directions is substantially stationary.

FIG. 5A schematically shows the temperature distribution of the front surface of the substrate P in relation to the positional relationship between the immersion region LR and the substrate P after the prescribed time that the immersion region LR is to be formed in a first area SR1 on the substrate P with a prescribed supply quantity elapses. In FIG 5A, the immersion region LR is locally formed in the first area SR1 on the substrate P (the substrate table 4T). Even if the actual temperature of the front surface of the substrate P is the second value $T_P$, there is a possibility that the temperature of the first area SR1, which is the area of the substrate P that the liquid LQ of the immersion region LR contacts, of the front surface of the substrate P will be substantially the same as the temperature of the liquid LQ (first value $T_L$). This is because the temperature of the front surface of the substrate P and the temperature of the liquid LQ reach a state of equilibrium after the prescribed time that the immersion region LR is to be formed in the first area SR1 on the substrate P elapses. Accordingly, when the liquid LQ that forms the immersion region LR on the first area SR1 is recovered via the recovery port 22 and the temperature of that recovered liquid LQ is detected by the first detection apparatus 31, that detection value is substantially the first value $T_L$.

FIG. 5B is a schematic drawing that shows the state immediately after the immersion region LR is moved from the first area SR1 to a separate second area SR2 on the substrate P. By the withdrawal of the immersion region LR from the first area SR1 on the substrate P, the temperature of the first area SR1 on the front surface of the substrate P, which is adjusted by the first temperature adjusting apparatus 41, gradually approaches the second value $T_P$. In addition, by disposing the immersion region LR in the second area SR2 on the substrate P, the temperature of the second area SR2 gradually approaches the first value $T_L$. Here, even though the immersion region LR is disposed on the second area SR2, the temperature of the second area SR2 does not immediately transition to the first value $T_L$, but is a third value $T_C$, which is lower than the second value $T_P$ and higher than the first value $T_L$, immediately after the immersion region LR is disposed in the second area SR2. Accordingly, when the liquid LQ that forms the immersion region LR immediately after it is disposed on the second area SR2 is recovered via the recovery port 22 and the temperature of that recovered liquid LQ is detected by the first detection apparatus 31, that detection value is substantially the third value $T_C$.

FIG. 5C schematically shows the temperature distribution of the front surface of the substrate P after the prescribed time that the immersion region LR is to be disposed in the second area SR2 on the substrate P elapses. After the immersion region LR is disposed in the second area SR2 and the prescribed time elapses, the temperature of the liquid LQ and the temperature of the second area SR2 reach a state of equilibrium. Accordingly, when the liquid LQ that forms the immersion region LR on the second area SR2 is recovered via the recovery port 22 and the temperature of that recovered liquid LQ is detected by the first detection apparatus 31, that detection value is substantially the first value $T_L$.

Figure 6A:
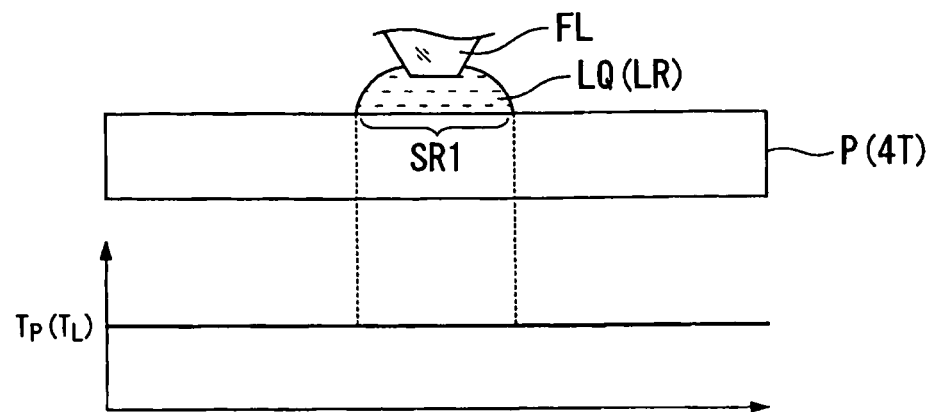
FIG. 6A is a schematic drawing for explaining the temperature distribution of the substrate front surface in relation to the positional relationship between the immersion region and the substrate.
Figure 6B:
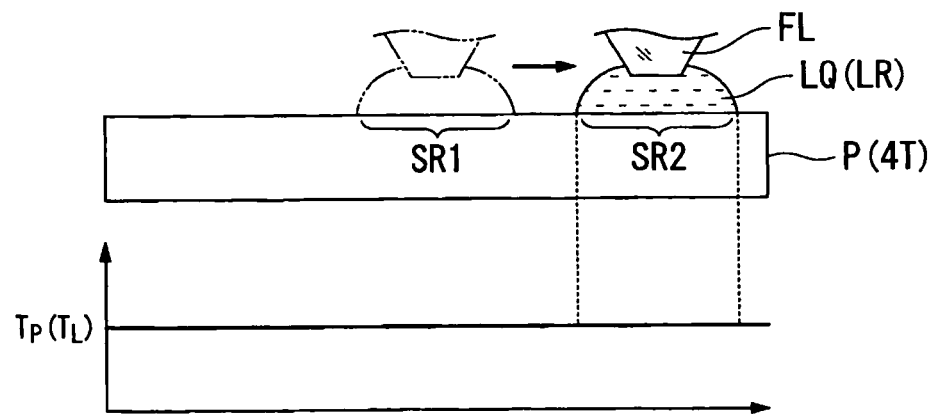
FIG. 6B is a schematic drawing for explaining the temperature distribution of the substrate front surface in relation to the positional relationship between the immersion region and the substrate.
Figure 6C:
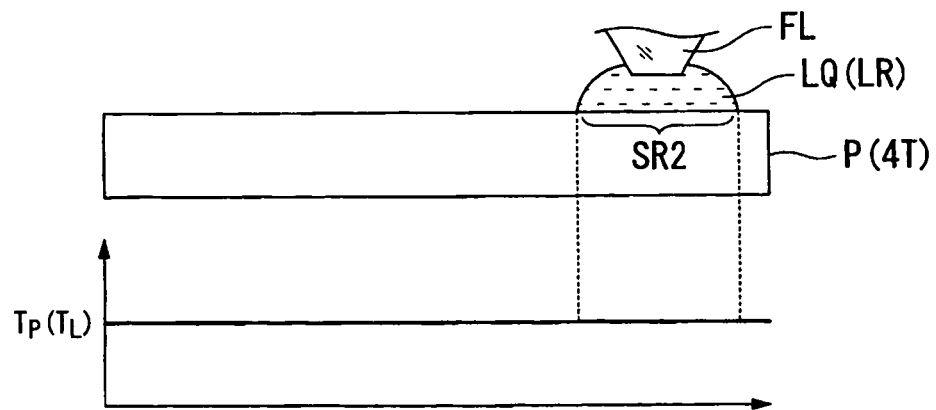
FIG. 6C is a schematic drawing for explaining the temperature distribution of the substrate front surface in relation to the positional relationship between the immersion region and the substrate.

FIGS. 6A-6C schematically show the temperature distributions of the front surface of the substrate P and the upper surface 4F of the substrate table 4T in relation to the positional relationship between the immersion region LR and the substrate P when there is no temperature differential between the liquid LQ and the front surface of the substrate P (the upper surface 4F of the substrate table 4T). The temperature of the liquid LQ and the temperature of the front surface of the substrate P are substantially the same; consequently, regardless of whether the immersion region LR is formed in the first area SR1 or the second area SR2 of the front surface of the substrate P, a temperature differential does not arise between the liquid LQ and the front surface of the substrate P. Accordingly, as shown in FIGS. 6A-6C, in the case wherein the liquid LQ is recovered while the substrate P is moved with respect to the immersion region LR, the detection value of the temperature of that recovered liquid LQ obtained by the first detection apparatus 31 is the first value $T_L$ (equals the second value $T_P$) in both the first and second areas SR1, SR2.

Figure 7:
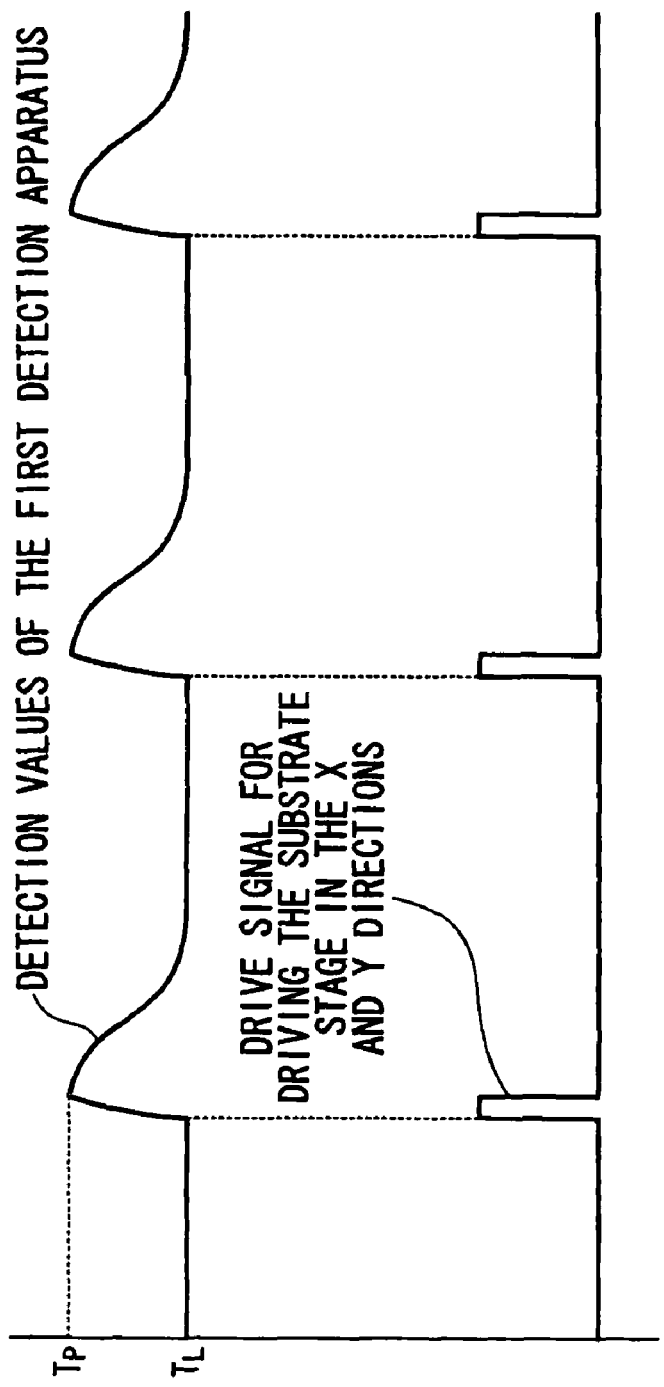
FIG. 7 is a schematic drawing for explaining the relationship between a detection value of a first detection apparatus and a drive signal that is applied to the substrate stage.

FIG. 7 is a schematic drawing that shows the detection results obtained by the first detection apparatus 31 when the liquid LQ is recovered while the substrate P is moved in the X and Y directions with respect to the immersion region LR; therein, FIG. 7(A) shows the detection values of the first detection apparatus 31, and FIG. 7(B) shows the drive signal that is applied to the substrate stage 4 in order to move the substrate P. It can be found that if the temperature of the liquid LQ of the immersion region LR and the temperature of the front surface of the substrate P differ, then the detection values of the first detection apparatus 31 fluctuate synchronously with the drive signal that is applied to the substrate stage 4, as shown by the schematic drawing in FIG. 7.

Thus, if there is a temperature differential between the substrate P and the liquid LQ that is supplied onto the substrate P via the supply ports 12, then the detection results of the temperature of the liquid LQ that is recovered via the recovery port 22 while the substrate P is moved in the X and Y directions with respect to the immersion region LR fluctuate. However, if there is substantially no temperature differential between the substrate P and the liquid LQ that is supplied onto the substrate P via the supply ports 12, then the detection results of the temperature of the liquid LQ that is recovered via the recovery port 22 while the substrate P is moved in the X and Y directions with respect to the immersion region LR substantially do not fluctuate. Accordingly, by recovering the liquid LQ while the substrate P is moved with respect to the immersion region LR, the control apparatus 7 can determine whether the temperature of the liquid LQ and the temperature of the substrate P are the same based on the detection result of the temperature of that recovered liquid LQ (the detection result of the first detection apparatus 31).

Furthermore, at this time, there is a possibility that there is a temperature differential between the liquid LQ and the last optical element FL; however, the liquid LQ that is supplied via the supply ports 12 constantly contacts the last optical element FL, and therefore the temperature of the liquid LQ and the temperature of the last optical element FL reach a state of equilibrium. In addition, it is possible to make the temperature of the liquid LQ and the temperature of the last optical element FL stably reach a state of equilibrium by increasing the quantity of the liquid LQ supplied per unit of time via the supply ports 12. Accordingly, the temperature differential between the liquid LQ and the last optical element FL does not substantially affect the detection results of the first detection apparatus 31 when information about the temperature differential between the liquid LQ and the substrate P is obtained.

As was explained referencing FIG. 5A through FIG. 7, if the liquid LQ is recovered while the substrate P is moved with respect to the immersion region LR, and it is determined that the temperature of the liquid LQ and the temperature of the substrate P are different based on the detection result of the temperature of the recovered liquid LQ, then the control apparatus 7 adjusts at least one of the temperature of the liquid LQ and the temperature of the substrate P (the substrate table 4T) so that the temperature differential between the liquid LQ and the substrate P becomes small. The control apparatus 7 can adjust the temperature of the liquid LQ using the liquid temperature adjusting apparatus 15, and can adjust the temperature of the substrate P using the first temperature adjusting apparatus 41. While varying at least one of the temperature of the liquid LQ and the temperature of the substrate P (the substrate table 4T), the control apparatus 7 detects the temperature of the recovered liquid LQ using the first detection apparatus 31 while the substrate P is moved with respect to the immersion region LR. In the present embodiment, the control apparatus 7 uses the liquid temperature adjusting apparatus 15 to adjust the temperature of the liquid LQ until the detection results of the temperature of the liquid LQ that is recovered via the recovery port 22 while the substrate P is moved in the X and Y directions with respect to the immersion region LR substantially no longer fluctuate.

Furthermore, the control apparatus 7 may use the first temperature adjusting apparatus 41 to adjust the temperature of the front surface of the substrate P (and the temperature of the upper surface 4F of the substrate table 4T)—without varying the temperature of the liquid LQ—until the detection results of the temperature of the liquid LQ that is recovered via the recovery port 22 while the substrate P is moved in the X and Y directions with respect to the immersion region LR substantially no longer fluctuate.

After the matching of the temperatures of the liquid LQ and the substrate P (the substrate table 4T) is complete, the control apparatus 7 starts the process (step SA2) of matching the temperatures of the last optical element FL and the liquid LQ that forms the immersion region LR.

The control apparatus 7 forms the immersion region LR of the liquid LQ on the substrate P by controlling the liquid immersion system 1 so that the liquid LQ is supplied onto the substrate P via the supply ports 12 at a prescribed supply quantity per unit of time (a prescribed supply quantity condition), and is recovered via the recovery port 22 at a prescribed recovery quantity per unit of time that is in accordance with the quantity that is supplied via the supply ports 12.

The liquid temperature adjusting apparatus 15 adjusts the temperature of the liquid LQ that is supplied to the optical path space K via the supply ports 12 to the first value $T_L$ (e.g., 23° C.). In addition, the temperature adjusting apparatus 6 adjusts the temperature of the plurality of the optical elements of the projection optical system PL, including the last optical element FL, using the first value $T_L$ as the target value.

The control apparatus 7 recovers the liquid LQ while varying the supply quantity per unit of time of the liquid LQ that is supplied to the optical path space K (onto the substrate P), and uses the first detection apparatus 31 to detect the temperature of the recovered liquid LQ. Specifically, the control apparatus 7 forms the immersion region LR by performing the operation of supplying a first supply quantity of the liquid LQ onto the substrate P and the operation of recovering the liquid LQ on the substrate P, and uses the first and second detection apparatuses 31, 32 to detect the temperature of the liquid LQ that is recovered via the recovery port 22 and the temperature of the liquid LQ that is supplied via the supply ports 12, respectively. Furthermore, the control apparatus 7 forms the immersion region LR by performing the operation of supplying a second supply quantity, which is different from the first supply quantity, of the liquid LQ onto the substrate P and the operation of recovering the liquid LQ on the substrate P, and uses the first and second detection apparatuses 31, 32 to detect the temperature of the liquid LQ that is recovered via the recovery port 22 and the temperature of the liquid LQ that is supplied via the supply ports 12, respectively.

The control apparatus 7 determines whether the temperature of the liquid LQ and the temperature of the last optical element FL are the same based on the detection result of the first detection apparatus 31 and the detection results of the second detection apparatuses 32.

If there is a temperature differential between the last optical element FL and the liquid LQ that is supplied to the optical path space K via the supply ports 12, then the detection results of the temperature of the liquid LQ that is recovered via the recovery port 22 while the quantity of the liquid LQ that is supplied from the supply ports 12 to the optical path space K (onto the substrate P) is varied fluctuates. However, if there is substantially no temperature differential between the last optical element FL and the liquid LQ that is supplied to the optical path space K via the supply ports 12, then the detection results of the temperature of the liquid LQ that is recovered via the recovery port 22 while the quantity of the liquid LQ that is supplied from the supply ports 12 to the optical path space K (onto the substrate P) is varied substantially do not fluctuate. This will now be explained referencing FIGS. 8A, 8B, and 9.

Figure 8A:
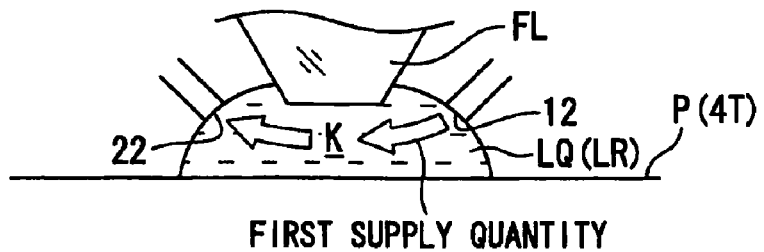
FIG. 8A is a schematic drawing for explaining an operation of recovering a liquid while varying the liquid supply quantity.
Figure 8B:
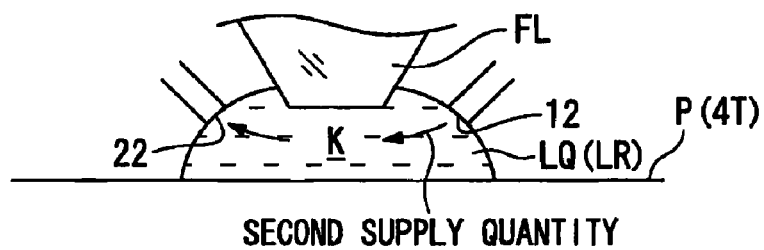
FIG. 8B is a schematic drawing for explaining an operation of recovering a liquid while varying the liquid supply quantity.

FIG. 8A schematically shows the operations of supplying the first supply quantity of the liquid LQ to the optical path space K and recovering a recovery quantity of the liquid LQ that is in accordance with the first supply quantity, and FIG. 8B schematically shows the operations of supplying the second supply quantity of the liquid LQ, which is less than the first supply quantity, to the optical path space K and recovering a recovery quantity of the liquid LQ in accordance with the second supply quantity. Furthermore, in FIGS. 8A and 8B, the nozzle member, which has the supply ports 12 and the recovery port 22, is illustrated in a simplified manner. In addition, FIG. 9 schematically shows the detection results obtained by the first detection apparatus 31 with respect to the temperature of the recovered liquid LQ when the first supply quantity of the liquid LQ and the second supply quantity of the liquid LQ supplied to the optical path space K are recovered.

Figure 9:
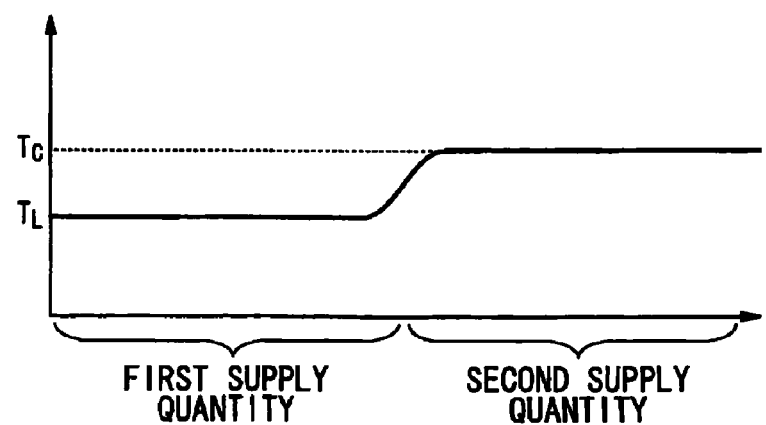
FIG. 9 is a schematic drawing for explaining the relationship between the liquid supply quantity and the detection value of the first detection apparatus.

In FIGS. 8A, 8B, and 9, the temperature of the liquid LQ that is supplied to the supply ports 12 by the liquid supply apparatus 11 is adjusted to the first value $T_L$. However, even though the temperature adjusting apparatus 6 adjusts the temperature of the last optical element FL using the first value $T_L$ as the target value, there is a possibility that the temperature of the last optical element FL will for some reason reach, for example, a fourth value $T_E$ that is higher than the first value $T_L$.

If the quantity of the liquid LQ supplied via the supply ports 12 is great, then the temperature of the liquid LQ recovered via the recovery port 22 is principally governed by the temperature of the liquid LQ supplied via the supply ports 12, and the temperature differential between the liquid LQ and the last optical element FL has little effect on the detection results of the first detection apparatus 31. Accordingly, if the quantity of the liquid LQ supplied via the supply ports 12 is great, then the detection value obtained when the liquid LQ that forms the immersion region LR is recovered via the recovery port 22 and the first detection apparatus 31 detects the temperature of that recovered liquid LQ is substantially the first value $T_L$.

If the quantity of the liquid LQ supplied via the supply ports 12 is small, then the temperature of the liquid LQ that is recovered via the recovery port 22 is principally governed by the temperature of the last optical element FL, and the temperature differential between the liquid LQ and the last optical element FL greatly affects the detection results of the first detection apparatus 31. Accordingly, if the quantity of the liquid LQ that is supplied via the supply ports 12 is small, then the detection value obtained by the first detection apparatus 31 when it detects the temperature of the liquid LQ that forms the immersion region LR and is recovered via the recovery port 22 is substantially the fourth value $T_E$.

However, if the temperature of the liquid LQ and the temperature of the last optical element FL are substantially the same, then the detection result obtained by the first detection apparatus 31 is the first value $T_L$ (equals the fourth value $T_E$) regardless of the quantity of the liquid LQ that is supplied.

Thus, if there is a temperature differential between the last optical element FL and the liquid LQ that is supplied to the optical path space K via the supply ports 12, then the detection results of the temperature of the liquid LQ that is recovered via the recovery port 22 will fluctuate in accordance with the quantity of the liquid LQ that is supplied per unit of time to the optical path space K via the supply ports 12; furthermore, if there is substantially no temperature differential between the last optical element FL and the liquid LQ that is supplied to the optical path space K via the supply ports 12, then the detection results of the temperature of the liquid LQ that is recovered via the recovery port 22 will substantially not fluctuate—even if the quantity of the liquid LQ that is supplied per unit of time to the optical path space K via the supply ports 12 varies. Accordingly, recovering the liquid LQ while varying the quantity of the liquid LQ that is supplied enables the control apparatus 7 to determine whether the temperature of the liquid LQ and the temperature of the last optical element FL are the same based on the detection result of the temperature of the recovered liquid LQ (the detection result of the first detection apparatus 31).

If the liquid LQ is recovered while the quantity of the liquid LQ supplied is varied and it is determined, based on the detection result of the temperature of the recovered liquid LQ, that the temperature of the liquid LQ and the temperature of the last optical element FL are different, then the control apparatus 7 adjusts at least one of the temperature of the liquid LQ and the temperature of the last optical element FL so that the temperature differential between the liquid LQ and the last optical element FL becomes small. The control apparatus 7 can use the liquid temperature adjusting apparatus 15 to adjust the temperature of the liquid LQ and can use the temperature adjusting apparatus 6 to adjust the temperature of the last optical element FL. While adjusting at least one of the temperature of the liquid LQ and the temperature of the last optical element FL, the control apparatus 7 uses the first detection apparatus 31 to detect the temperature of the recovered liquid LQ while varying the liquid supply quantity. In the present embodiment, the control apparatus 7 uses the liquid temperature adjusting apparatus 15 to adjust the temperature of the liquid LQ until the detection results of the temperature of the liquid LQ that is recovered via the recovery port 22 while the quantity of the liquid LQ that is supplied per unit of time to the optical path space K is varied substantially no longer fluctuate.

After the matching of the temperatures of the liquid LQ and the last optical element FL is complete, the control apparatus 7 makes the temperatures of the liquid LQ and the upper surface 4F of the substrate table 4T, including the front surface of the substrate P, match using a procedure that is similar to step SA1 discussed above (step SA3).

In step SA2 discussed above, the temperature of the liquid LQ is matched to the temperature of the last optical element FL, and therefore there is a possibility that the temperature of the liquid LQ will differ in step SA1 and step SA2. Accordingly, after performing step SA2, the temperature of the upper surface 4F of the substrate table 4T, including the front surface of the substrate P, is matched to the temperature of the liquid LQ using a procedure that is similar to step SA1 discussed above. In step SA3 in the present embodiment, the liquid LQ is recovered while the substrate P is moved with respect to the immersion region LR, and the control apparatus 7 uses the first temperature adjusting apparatus 41 to adjust the temperatures of the front surface of the substrate P and the upper surface 4F of the substrate table 4T based on the detection result of the temperature of the recovered liquid LQ so that the temperature differential between the liquid LQ and the substrate P (the substrate table 4T) becomes small.

Furthermore, the temperature of the liquid LQ, the temperature of the substrate table 4T, including the substrate P, and the temperature of the last optical element FL can be made to coincide with higher precision by repeating steps SA1-SA3 discussed above multiple times as needed.

Furthermore, if the temperature of the liquid LQ and the temperature of the last optical element FL are made to substantially match without varying the temperature of the liquid LQ in step SA2, then step SA3 may be omitted.

After the temperature of the liquid LQ, the temperature of the substrate table 4T, including the substrate P, and the temperature of the last optical element FL substantially coincide, the control apparatus 7 matches the temperatures of the liquid LQ and the measurement table 5T of the measurement stage 5 (step SA4).

As was explained referencing FIG. 3, the control apparatus 7 is capable of moving the immersion region LR between the upper surface 4F of the substrate table 4T and the upper surface 5F of the measurement table 5T. The control apparatus 7 moves the immersion region LR from the upper surface 4F of the substrate table 4T to the upper surface 5F of the measurement table 5T.

The liquid temperature adjusting apparatus 15 adjusts the temperature of the liquid LQ that is supplied to the optical path space K via the supply ports 12, and the second temperature adjusting apparatus 51 adjusts the temperature of the upper surface 5F of the measurement table 5T. The control apparatus 7 recovers the liquid LQ of the immersion region LR that is formed on the measurement table 5T via the recovery port 22, and uses the first detection apparatus 31 to detect the temperature of the liquid LQ that is recovered via the recovery port 22.

Similar to the principle that was explained referencing FIGS. 5A-5C and the like, if there is a temperature differential between the measurement table 5T and the liquid LQ that is supplied onto the measurement table 5T via the supply ports 12, then, when the liquid LQ of the immersion region LR that is recovered via the recovery port 22 immediately after the immersion region LR is moved from the substrate table 4T to the measurement table 5T, the detection results of the temperature of that recovered liquid LQ fluctuate. Moreover, if there is substantially no temperature differential between the liquid LQ and the measurement table 5T, then the detection results of the temperature of the liquid LQ that is recovered via the recovery port 22 substantially do not fluctuate.

In the present embodiment, the control apparatus 7 uses the first detection apparatus 31 to detect the temperature of the liquid LQ that is recovered via the recovery port 22 while moving the immersion region LR between the upper surface 5F of the measurement table 5T and the upper surface 4F of the substrate table 4T. If it is determined, based on the detection result of the first detection apparatus 31, that the temperature of the liquid LQ of the immersion region LR that is formed on the measurement table 5T and the temperature of the upper surface 5F of the measurement table 5T are different, then the control apparatus 7 uses the second temperature adjusting apparatus 51 to adjust the temperature of the upper surface 5F of the measurement table 5T so that the temperature differential between the liquid LQ and the upper surface 5F of the measurement table 5T becomes small. Thereby, the temperature of the upper surface 4F of the substrate table 4T, including the front surface of the substrate P, the temperature of the upper surface 5F of the measurement table 5T, the temperature of the last optical element FL, and the temperature of the liquid LQ substantially match.

Furthermore, at this point in time, the control apparatus 7 moves the immersion region LR between the upper surface 4F of the substrate table 4T and the upper surface 5F of the measurement table 5T; however, the control apparatus 7 can acquire information about the temperature differential between the liquid LQ and the upper surface 5F of the measurement table 5T by moving the immersion region LR between a first area, which is on the upper surface 5F of the measurement table 5T, and a second area, which is different from the first area.

After the temperature of the liquid LQ, the temperature of the upper surface 4F of the substrate table 4T, including the front surface of the substrate P, the temperature of the last optical element FL, and the temperature of the upper surface 5F of the measurement table 5T substantially coincide, the control apparatus 7 uses the measuring instruments that are provided to the measurement stage 5 (the measurement table 5T) to perform a prescribed measurement process as needed (step SA5). The measurement results of the measurement process that uses the measurement stage 5 are reflected in subsequent exposure processes. For example, the image forming characteristics of the projection optical system PL are adjusted (calibrated) based on the measurement results obtained by using the measuring instruments of the measurement stage 5.

Furthermore, the control apparatus 7 forms the immersion region LR of the liquid LQ on the substrate P, radiates the exposure light EL onto the substrate P through the liquid LQ, and exposes the substrate P (step SA6).

Furthermore, the abovementioned steps SA1-SA3 do not have to be performed for each of a plurality of substrates P. Particularly, if the temperature of the substrate P is adjusted before it is transported to the substrate table 4T and the temperature of the substrate P and the temperature of the substrate table 4T can be made to substantially coincide, then the abovementioned steps SA1-SA3 do not have to be performed for each substrate P, and the temperature of the liquid LQ, the temperature of the upper surface 4F of the substrate table 4T, including the front surface of the substrate P, the temperature of the last optical element FL, and the temperature of the upper surface 5F of the measurement table 5T can be made to substantially coincide.

As explained above, using the liquid LQ after it has contacted prescribed objects, such as the substrate P, the substrate table 4T, the last optical element FL, and the measurement table 5T, makes it possible to acquire information about the temperature of those objects efficiently and with high precision. Furthermore, based on the acquired temperature information, it is possible to take appropriate measures to prevent exposure failures from occurring, such as by reducing the temperature differential between any two of the objects and between the liquid LQ and any one of the objects, and thereby to expose the substrate through the liquid LQ satisfactorily. In the present embodiment, the temperature of the liquid LQ after it has contacted the objects is detected, which makes it possible to acquire information about the temperature differential with respect to the liquid LQ efficiently as the object temperature information.

In addition, the exposure apparatus EX of the present embodiment comprises the substrate stage 4 and the measurement stage 5 and can bring the temperature relationship between the substrate table 4T of the substrate stage 4 and the measurement table 5T of the measurement stage 5 into a desired state, and thereby can prevent temperature induced exposure failures from occurring and thus expose the substrate P through the liquid LQ satisfactorily.

In addition, the control apparatus 7 recovers the liquid LQ of the immersion region LR that is formed on the substrate table 4T and, based on the detection result of the temperature of that recovered liquid LQ, can derive information about the temperature of the substrate table 4T. In addition, the liquid LQ of the immersion region LR that is formed on the substrate P is recovered, and, based on the detection result of the temperature of that recovered liquid LQ, can derive information about the temperature of the measurement table 5T. Furthermore, the control apparatus 7 can determine the coincidence between the temperature of the substrate table 4T and the temperature of the measurement table 5T based on information about the temperature of the substrate table 4T and information about the temperature of the measurement table 5T.

If a plurality of the objects contact the liquid LQ and it is desired to, for example, acquire information about the temperature differential between the liquid LQ and any one of the objects and/or to acquire information about the temperature differential between any two of the objects, then a configuration is conceivable wherein a sensor that is capable of acquiring information about the temperature of the liquid LQ is provided at a prescribed position and a plurality of sensors that are capable of acquiring information about the temperatures of the objects are provided. Incidentally, if the temperature of the liquid LQ and the temperatures of the objects are detected using a plurality of sensors, then there is a possibility that it will be difficult to acquire information about the temperature differential between the liquid LQ and any one of the objects and the information about the temperature differential between any two of the objects accurately due to, for example, differences in the detection characteristics of each of the sensors and/or the detection sensitivities of the sensors. In addition, if a temperature sensor is prepared that has an external shape that is substantially the same as the substrate P, is capable of attaching to and detaching from the substrate holder 4H, and is held by the substrate holder 4H, then the temperature of the liquid LQ, the temperature of the substrate table 4T (the substrate holder 4H), and the like can be detected satisfactorily; however, it is difficult to detect the temperature of objects other than the substrate stage (e.g., the measurement stage) using that temperature sensor. In the present embodiment, the first detection apparatus 31, which can detect the temperature of the liquid LQ after it has contacted the objects, can be used to acquire information about the temperature differential between the liquid LQ and any one of the objects and the information about the temperature differential between any two of the objects efficiently and with high precision.

Furthermore, in the embodiment discussed above, the first detection apparatus 31 is used to detect the temperature of the liquid LQ that is recovered via the recovery port 22 so as to acquire the temperature of the liquid LQ after it has contacted the objects, e.g., the substrate P; however, any arbitrary configuration may be adopted as long as it has the capability of detecting the temperature of the liquid LQ after it has contacted the objects.

Furthermore, in the embodiments discussed above, the substrate P, which is for fabricating a device, is held by the substrate holder 4H, after which information about the temperature of the liquid LQ of the immersion region LR that is formed on the substrate P is acquired; however, a configuration may be adopted wherein a prescribed member (e.g., a dummy substrate) that has substantially the same external shape as the substrate P is held by the substrate holder 4H, after which information about the temperature of the liquid LQ of the immersion region LR that is formed on the dummy substrate is acquired.

Furthermore, in the embodiments discussed above, the first temperature adjusting apparatus 41, which is provided inside the substrate table 4T, is used to adjust the temperature of the substrate table 4T, but the temperature of the substrate table 4T (and, in turn, the temperature of the substrate P) may be adjusted using, for example, a medium (a coolant) that adjusts the temperature of the linear motors of the substrate stage drive apparatus. Each of the linear motors comprises, for example, a plurality of coils, which are arrayed in prescribed directions, and a housing (a jacket) that houses these coils, and the medium (the coolant) for adjusting (cooling) the temperature of the coils, which are heat generating bodies, flows inside the housing. If these linear motors are disposed in the vicinity of the substrate table 4T, then the temperature of the substrate table 4T (the temperature of the substrate P) can be adjusted indirectly by adjusting the temperature of the medium that flows inside the housings of the linear motors. In addition, both the first temperature adjusting apparatus 41 and the medium for adjusting the temperatures of the linear motors may be used to adjust the temperature of the substrate table 4T. Similarly, to adjust the temperature of the measurement table 5T, it is possible to use a medium (a coolant) to adjust the temperature of the linear motors of the measurement stage drive apparatus, and it is also possible to use that medium in parallel with the second temperature adjusting apparatus 51 that is provided inside the measurement table 5T.

Furthermore, in step SA2 discussed above, in order to derive information about the temperature of the last optical element FL, the liquid LQ is recovered while the quantity of the liquid LQ that is supplied per unit of time to the optical path space K is varied, and the temperature of that recovered liquid LQ is detected by the first detection apparatus 31; however, the temperature of the liquid LQ after it has contacted, for example, the last optical element FL may be detected in a state wherein, for example, both the liquid supply operation, wherein the supply ports 12 are used, and the liquid recovery operation, wherein the recovery port 22 is used, are stopped, and the supply of the liquid LQ to the optical path space K, the supply passageways and the recovery passageway inside the nozzle member 70, the supply pipes 13, and the recovery pipe 23 is stopped (in the state wherein the flow of the liquid LQ is stopped).

Furthermore, in the embodiments discussed above, the temperature of the liquid LQ, the temperature of the upper surface 4F of the substrate table 4T, including the front surface of the substrate P, the temperature of the upper surface 5F of the measurement table 5T, and the temperature of the last optical element FL are made to substantially coincide, even if the immersion region LR is formed at any position on the substrate P, thereby changes and variations in the temperature of the liquid LQ are prevented from occurring; however, it is acceptable even if there is a slight temperature differential between, for example, the liquid LQ and the substrate P or between the liquid LQ and the last optical element FL. For example, if the amount that aberration fluctuates in accordance with that temperature differential is known in advance, then it is possible to project an image of the pattern of the mask M onto the substrate P in a desired projection state by adjusting the image forming characteristics of the projection optical system PL using the image forming characteristics adjusting apparatus 9 in accordance with that amount of aberration fluctuation. Thus, the temperature of at least one of the liquid LQ and the objects that contact the liquid LQ may be adjusted so that a prescribed temperature relationship is achieved between the liquid LQ and any one of the objects that contact the liquid LQ (at least one of the upper surface 4F of the substrate table 4T, including the front surface of the substrate P, the upper surface 5F of the measurement table 5T, and the last optical element FL).

In addition, in the embodiments discussed above, the temperature of the liquid LQ, the temperature of the upper surface 4F of the substrate table 4T, including the front surface of the substrate P, and the temperature of the upper surface 5F of the measurement table 5T are made to substantially coincide; however, it is acceptable if there is a slight temperature differential between, for example, the upper surface 4F of the substrate table 4T and the upper surface 5F of the measurement table 5T. For example, if the amount by which the measurement values of the measuring instruments fluctuate in accordance with that temperature differential is known in advance, then it is possible to, for example, compensate the measurement values of the measuring instruments in accordance with that amount and to use those compensated measurement values to project an image of the pattern of the mask M onto the substrate P in a desired projection state. Thus, the temperature of at least one of the substrate table 4T and the measurement table 5T may be adjusted so that a prescribed temperature relationship is achieved between the substrate table 4T and the measurement table 5T.

Furthermore, if the temperature of the liquid LQ that is supplied from the liquid supply apparatus 11 to the supply ports 12 in accordance with the amount of drive (amount of adjustment) of liquid temperature adjusting apparatus 15 is known, or if the liquid temperature adjusting apparatus IS can adjust the temperature of the liquid LQ with high precision, then the second detection apparatus 32 may be omitted.

Furthermore, the embodiments discussed above explained an exemplary case wherein the temperature relationship between the substrate table 4T, which is capable of moving while holding the substrate P, and the measurement table 5T, which comprises the measuring instruments, is adjusted; however, the means of adjusting the temperature explained in the embodiments discussed above can be adapted to a multi-stage type exposure apparatus that comprises a plurality of substrate stages, as disclosed in, for example, Japanese Patent Application Publication No. H10-163099A, Japanese Patent Application Publication No. H10-214783A, Published Japanese Translation No. 2000-505958 of the PCT International Publication, U.S. Pat. Nos. 6,341,007, 6,400,441, 6,549,269, 6,590,634 6,208,407, and 6,262,796. Namely, the temperature relationship between a movable first substrate table, which is holds the substrate P, and a movable second substrate table, which holds the substrate P and is independent of the first substrate table, may be adjusted using the technique explained in the embodiments discussed above. For example, it is possible to make the temperature of the first substrate table and the temperature of the second substrate table substantially coincide.

Furthermore, in the embodiments discussed above, a display apparatus may be provided that displays the operation status of the exposure apparatus EX, e.g., the detection result of the first detection apparatus 31, the detection results of the second detection apparatuses 32, the quantity of the liquid LQ that is supplied per unit of time via the supply ports 12, the timing with which the drive signal is applied to each of the stages, and the like. In addition, a computer program may be written that graphs the operation status of the exposure apparatus EX and displays such on a prescribed display apparatus.

Furthermore, in the projection optical system in the embodiments discussed above, the optical path space on the image plane side of the last optical element is filled with the liquid, but it is also possible to adopt a projection optical system wherein the optical path space on the object plane side of the last optical element is also filled with the liquid, as disclosed in PCT International Publication WO2004/019128.

Furthermore, in each of the abovementioned embodiments, the nozzle member, which functions as a liquid immersion space forming apparatus that fills the optical path space of the exposure light EL with the liquid LQ and thereby forms the immersion space, is not limited to the configurations discussed above; for example, it is also possible to use the nozzle member (the liquid immersion system) disclosed in, for example, European Patent Application Publication No. 1,420,298, PCT International Publication WO2004/055803, PCT International Publication WO2004/057590, PCT International Publication WO2005/029559, PCT International Publication WO2004/086468 (corresponding U.S. Patent Application Publication No. 2005/0280791 A1), and Japanese Patent Application Publication No. 2004-289126A (corresponding U.S. Pat. No. 6,952,253).

Furthermore, although the liquid LQ in the present embodiment is water (pure water), it may be a liquid other than water; for example, if the light source of the exposure light EL is an $F_2$ laser, the light of which does not transmit through water, then it is acceptable to use a fluorine based fluid that is capable of transmitting $F_2$ laser light, such as perfluorinated polyether (PFPE) or fluorine based oil, as the liquid LQ. In addition, it is also possible to use, as the liquid LQ, a liquid (e.g., cedar oil) that is transparent to the exposure light EL, has the highest possible refractive index, and is stable with respect to the projection optical system PL and the photoresist that is coated on the front surface of the substrate P.

In addition, a liquid that has a refractive index of approximately 1.6 to 1.8 may be used as the liquid LQ. Examples of liquids that can be used as the liquid LQ include: a prescribed liquid that has an O—H bond or a C—H bond such as isopropanol, which has a refractive index of approximately 1.50, or glycerol (glycerin), which has a refractive index of approximately 1.61; a prescribed liquid (organic solvent) such as hexane, heptane, or decane; and a prescribed liquid such as decalin or bicyclohexyl. Alternatively, two or more arbitrary types of these prescribed liquids may be mixed together, or an abovementioned prescribed liquid may be added to (mixed with) pure water. Alternatively, the liquid LQ may be a liquid wherein a base, such as $H^+$, $Cs^+$, $K^+$, $Cl^-$, $SO_4^{2-}$, $PO_4^{2-}$, or an acid is added to (mixed with) pure water. Furthermore, the liquid LQ may be a liquid wherein fine particles of aluminum oxide or the like are added to (mixed with) pure water. These liquids can transmit ArF excimer laser light. In addition, the liquid LQ preferably has a small light absorption coefficient, low temperature dependency, and is stable with respect to the photosensitive material (a protective film such as a topcoat film, an antireflection film, or the like) that is coated on the projection optical system PL and/or the front surface of the substrate P.

The last optical element FL can be formed from, for example, quartz (silica). Alternatively, it may be formed from a monocrystalline fluorine compound material such as calcium fluoride (fluorite), barium fluoride, strontium fluoride, lithium fluoride, sodium fluoride, and $BaLiF_3$. Furthermore, the last optical element FL may be formed from lutetium aluminum garnet (LuAG). In addition, the last optical element FL may be formed from a monocrystalline fluorine compound material such as sodium fluoride.

Furthermore, the substrates P in the abovementioned embodiments are not limited to semiconductor wafers for fabricating semiconductor devices; for example, glass substrates for display devices, ceramic wafers for thin film magnetic heads, or the original plates of masks and reticles (synthetic quartz, silicon wafers) that are used by an exposure apparatus can be employed as the substrates P. The shape of the substrate P is not limited to a circle, and may be another shape, e.g., a rectangle.

Furthermore, in each of the abovementioned embodiments, the positional information of the mask stage 3 and the substrate stage 4 is measured using the interferometer systems, but the present invention is not limited thereto and, for example, an encoder system may be used that detects a scale (diffraction grating) that is provided to each stage. In this case, it is preferable to adopt a hybrid system that is provided with both an interferometer system and an encoder system, and to use the measurement results of the interferometer system to calibrate the measurement results of the encoder system. In addition, the positions of the stages may be controlled by switching between the interferometer system and the encoder system, or by using both.

The exposure apparatus EX can also be adapted to a step-and-scan type scanning exposure apparatus (a scanning stepper) that scans and exposes the pattern of the mask M while synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

In addition, the exposure apparatus EX can also be adapted to an exposure apparatus that uses a projection optical system (e.g., a dioptric projection optical system, which does not include a reflecting element, that has a ⅛ reduction magnification) to expose the substrate P with a reduced image of the full field of a first pattern in a state wherein the first pattern and the substrate P are substantially stationary. In this case, the exposure apparatus EX can also be adapted to a stitching type full-field exposure apparatus that subsequently further uses that projection optical system to expose the substrate P with a reduced image of the full field of a second pattern, in a state wherein the second pattern and the substrate P are substantially stationary, so that the second pattern partially overlaps the first pattern. In addition, the stitching type exposure apparatus can also be adapted to a step-and-stitch type exposure apparatus that transfers at least two patterns onto the substrate P so that they are partially superposed, and sequentially steps the substrate P.

In the exposure apparatus of each of the abovementioned embodiments, the mask M is disposed above (on the +Z side of) the projection optical system PL and the substrate P is disposed therebelow (on the −Z side); however, a projection optical system (a plurality of projection modules) may be provided so that it is flipped upside down vertically (in Z axial directions), the substrate may be disposed above (on the +Z side) of the projection optical system, and the mask may be disposed therebelow (on the −Z side), as disclosed in, for example, PCT International Publication WO2004/090956 (corresponding U.S. Patent Application Publication No. 2006/0023188A1).

In each of the abovementioned embodiments, positional information about the mask stage and the substrate stage is measured using interferometer systems, but the present invention is not limited thereto and, for example, an encoder system may be used that detects a scale (diffraction grating) that is provided to the upper surface of the substrate stage. In this case, it is preferable to adopt a hybrid system that is provided with both an interferometer system and an encoder system, and to use the measurement results of the interferometer system to calibrate the measurement results of the encoder system. In addition, the position of the substrate stage may be controlled by switching between the interferometer system and the encoder system, or by using both.

Each of the abovementioned embodiments explained an example of an exposure apparatus that comprises a projection optical system that has a plurality of optical elements, but the projection optical system may have one optical element. Alternatively, the present invention can be adapted to an exposure apparatus and an exposing method wherein a projection optical system is not used. Even if a projection optical system is not used, exposure light is radiated to the substrate through an optical member, such as a mask or a lens, and an immersion region is formed in a prescribed space between the substrate and such an optical member.

The type of exposure apparatus EX is not limited to a semiconductor device fabrication exposure apparatus that exposes the pattern of a semiconductor device on the substrate P, but can also be widely adapted to exposure apparatuses that are used for fabricating, for example, liquid crystal devices or displays, and exposure apparatuses that are used for fabricating thin film magnetic heads, image capturing devices (CCDs), micromachines, MEMS, DNA chips, or reticles and masks.

Furthermore, in the embodiments discussed above, a light transmitting type mask is used wherein a prescribed shielding pattern (or a phase pattern or a dimming pattern) is formed on a light transmitting substrate; however, instead of such a mask, it is also possible to use an electronic mask wherein a transmittance pattern, a reflected pattern, or a light emitting pattern is formed based on electronic data of the pattern to be exposed, as disclosed in, for example, U.S. Pat. No. 6,778, 257; here, an electronic mask, which is also called a variable forming mask, includes, for example, a digital micromirror device (DMD), which is one type of a non light emitting image display device (a spatial light modulator).

In addition, by forming interference fringes on the substrate P as disclosed in, for example, PCT International Publication WO2001/035168, the present invention can also be adapted to an exposure apparatus (a lithographic system) that exposes the substrate P with a line-and-space pattern.

Furthermore, the present invention can also be adapted to an exposure apparatus that combines, through a projection optical system, the patterns of two masks on a substrate, and double exposes, substantially simultaneously, a single shot region on that substrate with a single scanning exposure, as disclosed in, for example, Published Japanese Translation No. 2004-519850 of the PCT International Publication (corresponding U.S. Pat. No. 6,611,316).

Furthermore, each disclosure of every Japanese patent application publication and U.S. patent related to the exposure apparatus recited in each of the abovementioned embodiments, modified examples, and the like is hereby incorporated by reference in its entirety to the extent permitted by the national laws and regulations of the designated states (or the elected states) designated by the present international patent application.

As described above, the exposure apparatus EX of the abovementioned embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 10:
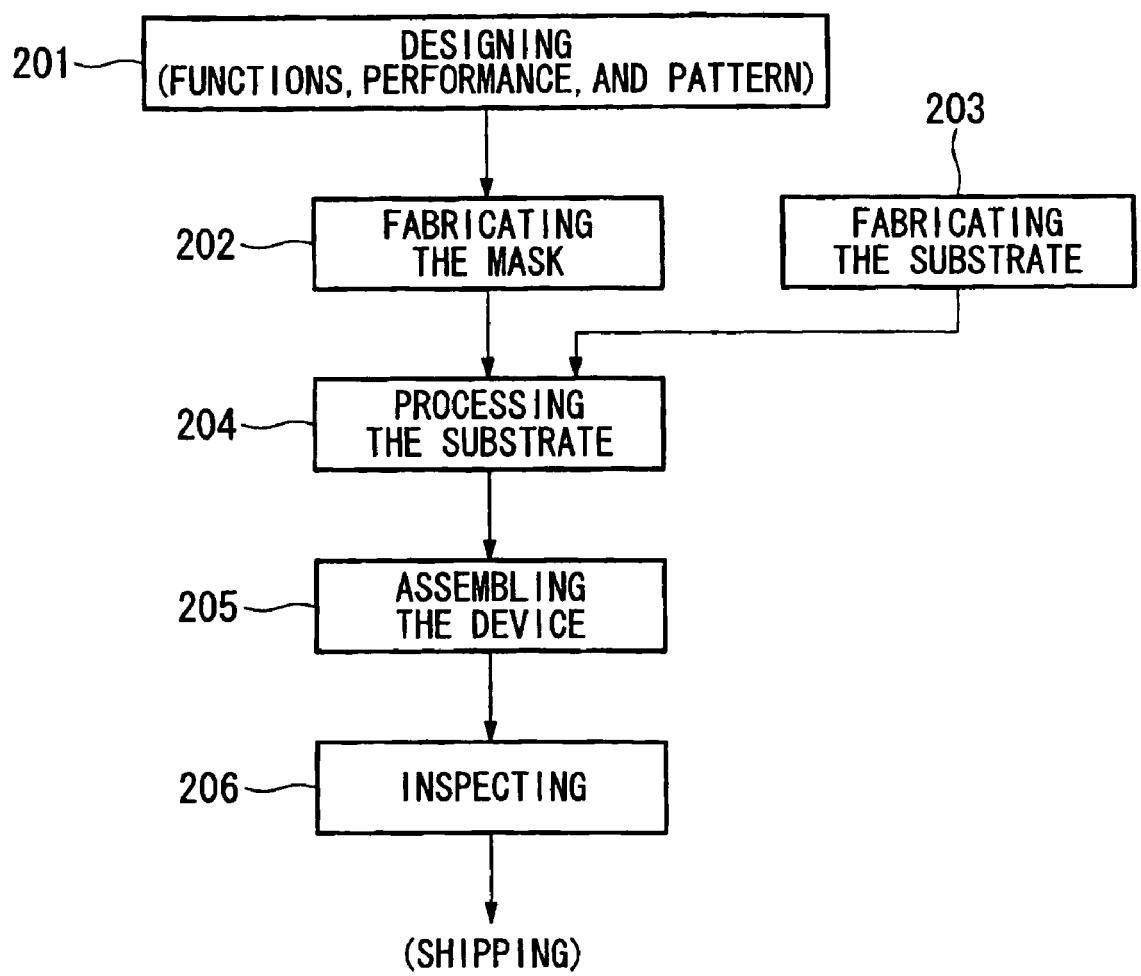
FIG. 10 is a flow chart diagram that depicts one example of a process of fabricating a microdevice.

As shown in FIG. 10, a micro-device, such as a semiconductor device, is manufactured by, for example: a step 201 that designs the functions and performance of the micro-device; a step 202 that fabricates a mask (reticle) based on this designing step; a step 203 that fabricates a substrate, which is the base material of the device; a substrate processing step 204 that includes substrate treatment processes, such as the process of exposing the pattern of the mask onto the substrate by using the exposure apparatus EX of the embodiments discussed above, a process that develops the exposed substrate, and a process that heats (cures) and etches the developed substrate; a device assembling step 205 (comprising a dicing process, a bonding process, and a packaging process); and an inspecting step 206.

The invention claimed is:

1. An exposing method that performs an immersion exposure, comprising:
   supplying a liquid onto a movable first object which holds a substrate;
   recovering the liquid supplied onto the movable first object;
   detecting a first temperature of the liquid recovered from the movable first object;
   supplying the liquid onto a movable second object which is capable of moving independently of the movable first object;
   recovering the liquid supplied onto the movable second object;
   detecting a second temperature of the liquid recovered from the movable second object;
   adjusting a temperature of at least one of the movable first object and the movable second object so that a prescribed temperature relationship is achieved between the movable first object and the movable second object, by at least one of adjusting the temperature of the movable first object based on the first temperature of the liquid and adjusting the temperature of the movable second object based on the second temperature of the liquid; and
   exposing the substrate, which is held by the movable first object, through the liquid.

2. An exposing method according to claim 1, wherein the prescribed temperature relationship includes a relationship wherein the temperature of the first object and the temperature of the second object substantially coincide.

3. An exposing method according to claim 2, wherein the prescribed temperature relationship is a relationship wherein the temperature of the first object and the temperature of the second object substantially coincide with the temperature of the liquid.

4. An exposing method according to claim 1, wherein the second object comprises a measuring instrument that performs an exposure-related measurement.

5. The exposing method according to claim 1, wherein the temperature of at least one of the movable first object and the movable second object is adjusted by flowing a liquid onto at least one of the movable first object and the movable second object.

6. The exposing method according to claim 1, wherein the temperature of at least one of the movable first object and the movable second object is adjusted by a heater or a Peltier element provided to at least one of the movable first object and the movable second object.

7. The exposing method according to claim 1, wherein the temperature of the movable first object or the movable second object is detected under a predetermined detection condition.

8. The exposing method according to claim 7, wherein the predetermined detection condition includes a relative positional relationship between the liquid on the movable first object and the movable first object.

9. The exposing method according to claim 7, wherein the predetermined detection condition includes a relative positional relationship between the liquid on the movable second object and the movable second object.

10. The exposing method according to claim 7, wherein the predetermined detection condition includes a supply quantity that is used when the liquid is supplied onto the movable first object or the movable second object.

11. The exposing method according to claim 7, wherein the temperature of the movable first object or the movable second object is detected while varying the predetermined detection condition.

12. The exposure method according to claim 11, wherein the temperature of the movable first object or the movable second object is detected while varying a supply quantity of liquid.

13. The exposing method according to claim 1, wherein the movable second object is capable of holding a substrate.

14. The exposure method according to claim 1, wherein the temperature of at least one of the movable first object and the second object is adjusted by flowing a temperature controlled liquid to a passageway that is provided to at least one of the movable first object and the second object.

15. The exposure method according to claim 1, wherein the liquid is supplied on the substrate held by the movable first object when detecting the first temperature of the liquid.

16. The exposure method according to claim 15, wherein the substrate includes a dummy substrate.

17. The exposure method according to claim 1, wherein the liquid is supplied onto the movable first object while moving the movable first object.

18. The exposure method according to claim 17,
wherein the liquid is supplied onto several portions of the movable first object when detecting the first temperature of the liquid.

19. The exposure method according to claim 1,
wherein the liquid of an immersion region on the movable first object is moved onto the movable second object when supplying the liquid onto the movable second object.

20. The exposure method according to claim 1,
wherein the liquid is supplied onto the movable second object while moving the movable second object.

21. The exposure method according to claim 20,
wherein the liquid is supplied onto several portions of the movable second object.

22. The exposure method according to claim 1,
wherein the first temperature of the liquid is detected while moving the movable first object.

23. The exposure method according to claim 1,
wherein the second temperature of the liquid is detected while moving the movable second object.

24. An immersion exposure apparatus that exposes a substrate, comprising:
an optical member that emits an exposure beam toward the substrate;
a first object that holds the substrate and is capable of moving to a position at which the first object opposes the optical member;
a second object that is capable of moving independently of the first object and of moving to a position at which the second object opposes the optical member;
a liquid supply device that supplies a liquid;
a liquid recovery device that recovers the supplied liquid;
a detection device that detects a temperature of the liquid recovered using the liquid recovery device; and
an adjusting apparatus that adjusts a temperature of at least one of the first object and the second object so that the first object and the second object achieve a prescribed temperature relationship, wherein
the liquid is supplied onto the first object via the liquid supply device when the first object is under the optical member, and the supplied liquid is recovered from the first object using the liquid recovery device, and a first temperature of the liquid recovered from the first object is detected by the detection device,
the liquid is supplied onto the second object using the liquid supply device when the second object is under the optical member, and the supplied liquid is recovered from the second object using the liquid recovery device, and a second temperature of the liquid recovered from the second object is detected by the detection device, and
the adjustment of the temperature includes at least one of adjusting the temperature of the first object based on the first temperature of the liquid and adjusting the temperature of the second object based on the second temperature of the liquid.

25. An exposure apparatus according to claim 24, wherein the adjusting apparatus performs the adjustment so that the temperature of the first object and the temperature of the second object substantially coincide with the temperature of the liquid.

26. An exposure apparatus according to claim 24, wherein the second object further comprises a measuring instrument that performs an exposure-related measurement.

27. An exposure apparatus according to claim 24, wherein the second object is capable of holding the substrate.

28. The immersion exposure apparatus according to claim 24,
wherein the temperature of at least one of the first object and the second object is adjusted by flowing the liquid onto at least one of the first object and the second object.

29. The immersion exposure apparatus according to claim 24,
wherein the temperature of at least one of the first object and the second object is adjusted by a heater or a Peltier element provided to at least one of the first object and the second object.

30. The immersion exposure apparatus according to claim 24,
wherein the temperature of the first object or the second object is detected under a predetermined detection condition.

31. The immersion exposure apparatus according to claim 30,
wherein the predetermined detection condition includes a relative positional relationship between the liquid on the first object and the first object.

32. The immersion exposure apparatus according to claim 30,
wherein the predetermined detection condition includes a relative positional relationship between the liquid on the second object and the second object.

33. The immersion exposure apparatus according to claim 30,
wherein the predetermined detection condition includes a supply quantity that is used when the liquid is supplied onto the first object or the second object.

34. The immersion exposure apparatus according to claim 30,
wherein the temperature of the first object or the second object is detected while varying the predetermined detection condition.

35. The exposure method according to claim 34,
wherein the temperature of the movable first object or the movable second object is detected while varying a supply quantity of liquid.

36. An immersion exposure apparatus according to claim 24,
wherein the temperature of at least one of the movable first object and the second object is adjusted by flowing a temperature controlled liquid to a passageway that is provided to at least one of the movable first object and the second object.

37. An immersion exposure apparatus according to claim 24,
wherein the liquid is supplied on the substrate held by the movable first object when detecting the temperature of the recovered liquid.

38. An immersion exposure apparatus according to claim 37,
wherein the substrate includes a dummy substrate.

39. An immersion exposure apparatus according to claim 24,
wherein the liquid is supplied onto the movable first object while moving the movable first object.

40. An immersion exposure apparatus according to claim 39,
wherein the liquid is supplied onto several portions of the movable first object when detecting the temperature of the recovered liquid.

41. An immersion exposure apparatus according to claim 24, wherein the liquid of an immersion region on the movable first object is moved onto the movable second object when supplying the liquid onto the movable second object.

42. An immersion exposure apparatus according to claim 24,
wherein the liquid is supplied onto the movable second object while moving the movable second object.

43. An immersion exposure apparatus according to claim 42,
wherein the liquid is supplied onto several portions of the movable second object when detecting the temperature of the recovered liquid.

44. An immersion exposure apparatus according to claim 24,
wherein the temperature of the recovered liquid is detected while moving the movable first object.

45. An immersion exposure apparatus according to claim 24,
wherein the temperature of the recovered liquid is detected while moving the movable second object.

46. An immersion exposure apparatus that exposes a substrate, comprising:
an optical member that emits an exposure beam toward the substrate;
a first object that holds the substrate and is capable of moving to a position at which the first object opposes the optical member;
a second object that is capable of moving independently of the first object and moving to a position at which the second object opposes the optical member and that does not hold the substrate;
a liquid supply device that supplies a liquid onto the second object;
a liquid recovery device that recovers the liquid supplied onto the second object;
a detection device that detects a temperature of the liquid recovered from the second object; and
an adjusting apparatus that adjusts a temperature of the second object so that a prescribed temperature relationship is achieved between the first object and the second object, wherein
the liquid is supplied onto the second object using the liquid supply device when the second object is under the optical member, and the supplied liquid is recovered from the second object using the liquid recovery device, and the temperature of the liquid recovered from the second object is detected by the detection device, and
wherein the adjustment of the temperature includes adjusting the temperature of the second object based on the detected temperature of the liquid.

47. An exposure apparatus according to claim 46, wherein the second object further comprises a measuring instrument that receives the exposure beam.

48. The immersion exposure apparatus according to claim 46,
wherein the temperature of the second object is adjusted by flowing a liquid onto the second object.

49. The immersion exposure apparatus according to claim 46,
wherein the temperature of the second object is adjusted by a heater or a Peltier element provided to the second object.

50. The immersion exposure apparatus according to claim 46,
wherein the temperature of the second object is detected under a predetermined detection condition.

51. The immersion exposure apparatus according to claim 50,
wherein the predetermined detection condition includes a relative positional relationship between the liquid on the second object and the second object.

52. The immersion exposure apparatus according to claim 50,
wherein the predetermined detection condition includes a supply quantity that is used when the liquid is supplied onto the second object.

53. The immersion exposure apparatus according to claim 50,
wherein the temperature of the second object is detected while varying the predetermined detection condition.

* * * * *